US008947565B2

(12) United States Patent
Okada et al.

(10) Patent No.: US 8,947,565 B2
(45) Date of Patent: Feb. 3, 2015

(54) SOLID-STATE IMAGE CAPTURE ELEMENT AND IMAGE CAPTURE DEVICE COMPRISING SAID SOLID-STATE IMAGE CAPTURE ELEMENT, AND IMAGE CAPTURE CONTROL METHOD AND IMAGE CAPTURE CONTROL PROGRAM

(71) Applicant: Panasonic Corporation, Osaka (JP)

(72) Inventors: Yusuke Okada, Osaka (JP); Hiroyoshi Komobuchi, Kyoto (JP); Takeo Azuma, Kyoto (JP); Sanzo Ugawa, Osaka (JP); Taro Imagawa, Osaka (JP)

(73) Assignee: Panasonic Corporation, Osaka (JP)

( * ) Notice: Subject to any disclaimer, the term of this patent is extended or adjusted under 35 U.S.C. 154(b) by 65 days.

(21) Appl. No.: 13/719,806

(22) Filed: Dec. 19, 2012

(65) Prior Publication Data
US 2013/0107087 A1 May 2, 2013

Related U.S. Application Data

(63) Continuation of application No. PCT/JP2011/002759, filed on May 18, 2011.

(30) Foreign Application Priority Data

Jul. 2, 2010 (JP) ................................. 2010-151996

(51) Int. Cl.
*H04N 3/14* (2006.01)
*H04N 5/335* (2011.01)
(Continued)

(52) U.S. Cl.
CPC .............. *H04N 9/045* (2013.01); *H04N 5/365* (2013.01); *H04N 5/3742* (2013.01); *H04N 5/3537* (2013.01); *H04N 5/347* (2013.01); *H01L 27/14621* (2013.01)

USPC .......... 348/294; 348/298; 348/302; 348/308; 348/312

(58) Field of Classification Search
USPC .................... 348/220.1, 294–324; 250/208.1; 257/290–292
See application file for complete search history.

(56) References Cited

U.S. PATENT DOCUMENTS

2006/0098255 A1* 5/2006 Hyodo ........................... 358/521
2006/0274169 A1* 12/2006 Watanabe et al. .......... 348/240.3
(Continued)

FOREIGN PATENT DOCUMENTS

JP  2006-253876 A  9/2006
JP  2008-199403 A  8/2008
(Continued)

OTHER PUBLICATIONS

International Search Report for corresponding International Application No. PCT/JP2011/002759 mailed Aug. 23, 2011.
(Continued)

*Primary Examiner* — Yogesh Aggarwal
(74) *Attorney, Agent, or Firm* — Renner, Otto, Boisselle & Sklar, LLP

(57) ABSTRACT

In an embodiment, a solid-state image sensor comprises: pixels arranged in columns and rows; read signal lines each connected to pixels arranged in a row direction; and output signal lines each connected to pixels arranged in a column direction. The read signal lines are classified into a first type of read signal lines each connected to a group of pixels on which R and B rays are incident, and a second type of read signal lines each connected to a group of pixels on which G rays are incident. Two pixels (R, B) on two adjacent columns are arranged on two opposite sides with respect to the first type of read signal line. Two pixels (Gr, Gb) on two adjacent columns are arranged on two opposite sides with respect to the second type of read signal line.

17 Claims, 21 Drawing Sheets

(51) Int. Cl.
*H04N 9/04* (2006.01)
*H04N 5/365* (2011.01)
*H04N 5/374* (2011.01)
*H04N 5/353* (2011.01)
*H04N 5/347* (2011.01)
*H01L 27/146* (2006.01)

(56) References Cited

U.S. PATENT DOCUMENTS

| | | | |
|---|---|---|---|
| 2009/0219420 A1* | 9/2009 | Kuroda | 348/281 |
| 2010/0315534 A1 | 12/2010 | Azuma et al. | |
| 2010/0315539 A1 | 12/2010 | Azuma et al. | |
| 2010/0327391 A1* | 12/2010 | Mccarten et al. | 257/447 |
| 2011/0310279 A1* | 12/2011 | Enge et al. | 348/294 |

FOREIGN PATENT DOCUMENTS

| | | |
|---|---|---|
| JP | 2009-206883 A | 9/2009 |
| JP | 2009-272820 A | 11/2009 |
| WO | 2009/019823 A1 | 2/2009 |
| WO | 2009/019824 A1 | 2/2009 |

OTHER PUBLICATIONS

International Preliminary Report on Patentability for corresponding International Application No. PCT/JP2011/002759 dated Sep. 25, 2012.

Takeo Azuma et al., "A 2.2/3-inch 4K2K CMOS Image Sensor Based on Dual Resolution and Exposure Technique", Proceedings in IEEE International Solid-State Circuit Conference 2010, pp. 560(408)-562(410), 2010.

* cited by examiner

SOLID-STATE IMAGE CAPTURE ELEMENT AND IMAGE CAPTURE DEVICE COMPRISING SAID SOLID-STATE IMAGE CAPTURE ELEMENT, AND IMAGE CAPTURE CONTROL METHOD AND IMAGE CAPTURE CONTROL PROGRAM

This is a continuation of International Application No. PCT/JP2011/002759, with an international filing date of May 18, 2011, which claims priority of Japanese Patent Application No. 2010-151996, filed on Jul. 2, 2010, the contents of which are hereby incorporated by reference.

BACKGROUND

1. Technical Field

The present disclosure relates to a solid-state image sensor, an image capture device including the solid-state image sensor and a method and program for controlling image capturing. More particularly, the present disclosure relates to a solid-state image sensor and image capture device which can capture an image at a different frame rate for a particular color component included in incoming light from the other color components thereof.

2. Description of the Related Art

A known solid-state image sensor includes a semiconductor layer in which photoelectric transducers such as photodiodes are arranged two-dimensionally and an array of color filters which is arranged closer to the light source than the semiconductor layer is. A color filter limits the wavelength of a light ray to be incident on each photoelectric transducer to a particular wavelength range such as the R (red), G (green) or B (blue) wavelength range. In each pixel of the solid-state image sensor, a light ray that has been transmitted through a color filter in the color allocated to that pixel (i.e., an R, G or B ray) is received at the photoelectric transducer. The photoelectric transducer generates a quantity of electric charge corresponding to the quantity of the light ray that has been incident on the pixel and then transmitted through the color filter of that pixel (which will be referred to herein as "incident light quantity").

Those pixels are arranged in rows and columns on the image capturing plane of the solid-state image sensor. In order to address respective pixels and read a signal representing the quantity of electric charge that has been stored in a pixel of interest (i.e., a pixel signal), a lot of signal lines that are connected to those pixels and peripheral circuits that are connected to those signal lines are needed.

In a CMOS image sensor, a photoelectric transducer and a plurality of transistors to read a signal with a level representing the quantity of electric charge that has been generated and stored by the photoelectric transducer are arranged in an area corresponding to one pixel of the image capturing plane. Thus, one "pixel" of a CMOS image sensor is ordinarily made up of a single photoelectric transducer and multiple transistors.

In this description, a pixel in which a filter that transmits an R ray (i.e., an R filter) is arranged closer to the light source, a pixel in which a filter that transmits a G ray (i.e., a G filter) is arranged closer to the light source, and a pixel in which a filter that transmits a B ray (i.e., a B filter) is arranged closer to the light source will be referred to herein as an "R pixel", a "G pixel" and a "B pixel", respectively, for the sake of simplicity. Also, an image obtained from multiple R pixels that are arranged on an image sensor, an image obtained from multiple G pixels arranged there, and an image obtained from multiple B pixels arranged there will be referred to herein as an "R image", a "G image" and a "B image", respectively. These images can be obtained by reading pixel signals from a lot of pixels that are arranged on the image capturing plane. The image data is read on a frame-by-frame basis. And the number of times image data is read per second is called a "frame rate".

In order to obtain a high-resolution, high-frame-rate moving picture using such a solid-state image sensor, not just the resolution needs to be increased by reducing the area of each pixel but also the frame rate needs to be increased by shortening the charge storage period (i.e., exposure time) of respective pixels. However, if the area of each pixel were reduced and if the exposure time were shortened, then the quantity of the light incident on each pixel would decrease. And since such a decrease in the quantity of light incident will lower the output level of a pixel signal, the SNR (signal to noise ratio) of a moving picture will eventually decrease, which is a problem.

In order to overcome such a problem, it was proposed that the R, G and B color components be captured at mutually different resolutions and in mutually different exposure times. For that purpose, a technique for separating incident light into R, G and B components and capturing images using two different image sensors for two groups formed by these color components is disclosed in PCT International Application Publication No. 2009/019823 and PCT International Application Publication No. 2009/019824. For example, if R and B color components are captured at a low resolution and a high frame rate, images with a temporally high resolution can be obtained for the R and B color components. Meanwhile, if the G color component is captured at a high resolution and a low frame rate, then the exposure time and spatial resolution required can be secured for the G color component and a sufficient quantity of light can be obtained. As a result, a G image with a high SNR can be obtained at a high spatial resolution. And if a high-resolution, high-frame-rate moving picture is restored by performing image processing on those color component images that have been captured at a low resolution and a high frame rate and the color component image that has been captured at a high resolution and a low frame rate, a high-resolution and high-frame-rate color moving picture can be obtained.

If images are captured using different exposure times and different frame rates on a color component basis as described above, pixel signals are output from the image sensor at mutually different times from one color component to another. That is why to perform such an image capturing process using a single-panel color image sensor, read signals are supplied to multiple groups of pixels associated with the respective color components at respective timings corresponding to their frame rates independently of each other and the pixel signals representing the respective color components are output independently of each other.

In order to set the frame rate for obtaining a G image to be lower than the frame rate for obtaining R and B images in a single-panel color image sensor, the time interval at which a signal representing the electric charge that has been stored in G pixels is read is set to be longer than the time interval at which a signal representing the electric charge that has been stored in R and B pixels is read. The article by Takeo Azuma et al, "A 2.2/3-inch 4K2K CMOS Image Sensor Based on Dual Resolution and Exposure Technique", Proceedings in IEEE International Solid-State Circuit Conference 2010, pp. 408-410, 2010, discloses an image sensor which supplies pixel output read signals to the R, G and B pixels independently of each other and which can read signals from two pixels that are adjacent to each other in the column direction (i.e., vertically) in parallel with each other.

FIG. 25 illustrates a configuration for a single-panel image sensor as disclosed in the above article. In FIG. 25, the reference sign R denotes pixels that detect the intensity of the R component of incident light, the reference sign B denotes pixels that detect the intensity of the B component of the incident light, and the reference signs Gr and Gb denote pixels that detect the intensity of the G component of the incident light. In this image sensor, rows in which R and G pixels are alternately arranged horizontally (RG rows) and rows in which B and G pixels are alternately arranged horizontally (BG rows) vertically alternate with each other.

In this description, the G pixels of the RG rows will be referred to herein as "Gr pixels" and the G pixels of the BG rows will be referred to herein as "Gb pixels". According to the above article, the exposure time of the G pixels is supposed to be longer than that of the R and B pixels and the G pixel signals are supposed to be output at a low frame rate. As shown in FIG. 25, read signal lines for passing read signals to respective pixels and output signal lines for passing the pixel output signals to the processing of the next stage, including A/D conversion, are separately provided for R, G and B pixels. As a result, as shown on the right-hand side of this drawing, two signal lines, namely one read signal line that is connected to the R or B pixels and another read signal line that is connected to the G pixels, run horizontally along each row of pixels. Meanwhile, two more signal lines, namely one output signal line that is connected to the R or B pixels and another output signal line that is connected to the G pixels, run vertically along each column of pixels. By adopting such a configuration, read signals can be supplied independently of each other to the R, B and G pixels and outputs can be obtained (i.e., signals can be read) in parallel with each other from the pixels in respective colors.

SUMMARY

In a known arrangement, two read signal lines are arranged for each row of pixels and two output signal lines are arranged for each column of pixels as shown in FIG. 25, for example. That is why since those signal lines account for a greater percentage of the given image capturing area, the aperture area of each pixel decreases, thus eventually causing a decrease in the sensitivity of the pixel. This problem becomes even more remarkable if the size of the pixel itself decreases.

A solid-state image sensor according to the present invention includes: a pixel array including a plurality of pixels that are arranged in columns and rows; a plurality of read signal lines, each of which is connected to a number of pixels that are arranged in a row direction; a plurality of output signal lines, each of which is connected to a number of pixels that are arranged in a column direction; and a color filter array which defines the color components of light rays to be incident on the plurality of pixels. The read signal lines are classified into a first type of read signal lines, each of which is connected to a group of pixels on which light rays with a first set of color components are incident, and a second type of read signal lines, each of which is connected to a group of pixels on which light rays with a second set of color components, other than the first set of color components, are incident. Among a plurality of pixels which are connected to each said first type of read signal line and on which light rays with the first set of color components are incident, two pixels on two adjacent columns are arranged on two opposite sides with respect to the first type of read signal line. Among a plurality of pixels which are connected to each said second type of read signal line and on which light rays with the second set of color components are incident, two pixels on two adjacent columns are arranged on two opposite sides with respect to the second type of read signal line.

According to embodiments of the present disclosure, an image sensor can set the frame rate for an image with a particular color component to be higher than that of an image with any other color component and can have a smaller number of lines than the image sensor disclosed in the above article.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Hereinafter, embodiments of the present disclosure will be described with reference to the accompanying drawings.

Embodiment 1

Figure 1:
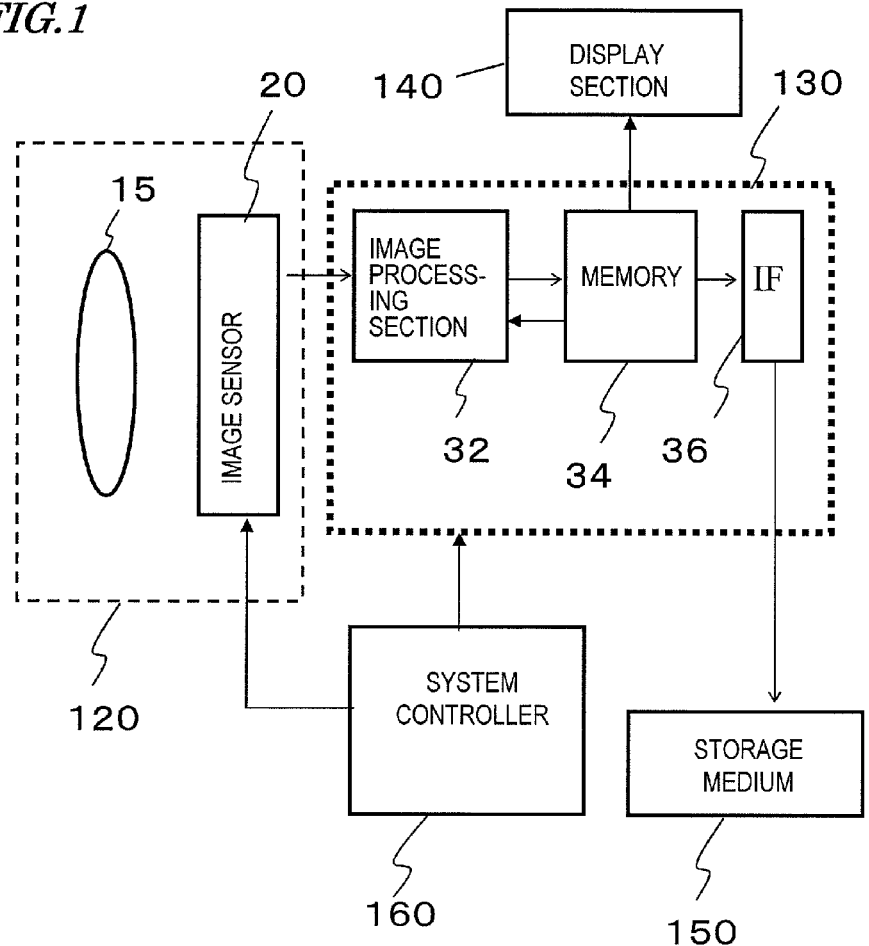
FIG. 1 is a block diagram illustrating an overall configuration for an image capture device as a first embodiment of the present disclosure.

FIG. 1 is a block diagram illustrating an exemplary configuration for an image capture device as a first embodiment.

As shown in FIG. 1, the image capture device of this embodiment includes an image capturing section 120, a signal processing section 130 which performs various kinds of signal processing, a display section 140 which displays the image that has been captured, a storage medium 150 which stores image data, and a system controller 160 which controls these sections.

The image capturing section 120 of this embodiment includes a shooting lens 15 and a solid-state image sensor (which will be simply referred to herein as an "image sensor") which receives the light that has been transmitted through the shooting lens 15. The image sensor 20 of this embodiment is a single-panel color image sensor. The configurations and operations of the image sensor 20 will be described in detail later.

The shooting lens 15 has a known structure and may actually be implemented as a lens unit that is made up of multiple lenses. The shooting lens 15 is driven by a mechanism (not shown) to carry out operations to get optical zooming and auto-focusing (AF) done as needed.

The output signal of the image sensor 20 is passed to the signal processing section 130. In this embodiment, the signal processing section 130 includes an image processing section 32, a memory 34, and an interface (IF) section 36. The signal processing section 130 is connected to the display section 140 and the storage medium 150.

The image processing section 32 receives pixel signals, of which the frame rate changes from one color component to another, and performs the image processing disclosed in the above-referenced prior art references (i.e., temporal and spatial resolution increasing processing). The image processing section 32 may be a combination of a hardware component such as a known digital signal processor (DSP) and a software program for use to perform image processing. The memory 34 may be a DRAM, for example. And the memory 34 not only stores the image data supplied from the image capturing section 120 but also temporarily retains the image data that has been subjected to various kinds of image processing by the image processing section 32 or image data that is still being subjected to such image processing. The image data is then either displayed on the display section 140 or stored on the storage medium 150 by way of the interface section 36. Optionally, the image data may also be transmitted wirelessly or through a cable to another device (not shown) via a telecommunications device (not shown).

All of these components are controlled by the system controller 160 including a central processing unit (CPU) and a flash memory, none of which are shown in FIG. 1. Actually, the image capture device of this embodiment further includes an optical viewfinder, a power supply (or battery), a flashlight and other known members. However, description thereof will be omitted herein because none of those members are essential ones that would make it difficult to understand how the present disclosure works unless they were described fully.

The image capture device of this embodiment is characterized, first and foremost, by the image sensor 20. Thus, the configuration and operation of the image sensor 20 will be described in detail.

Figure 2:
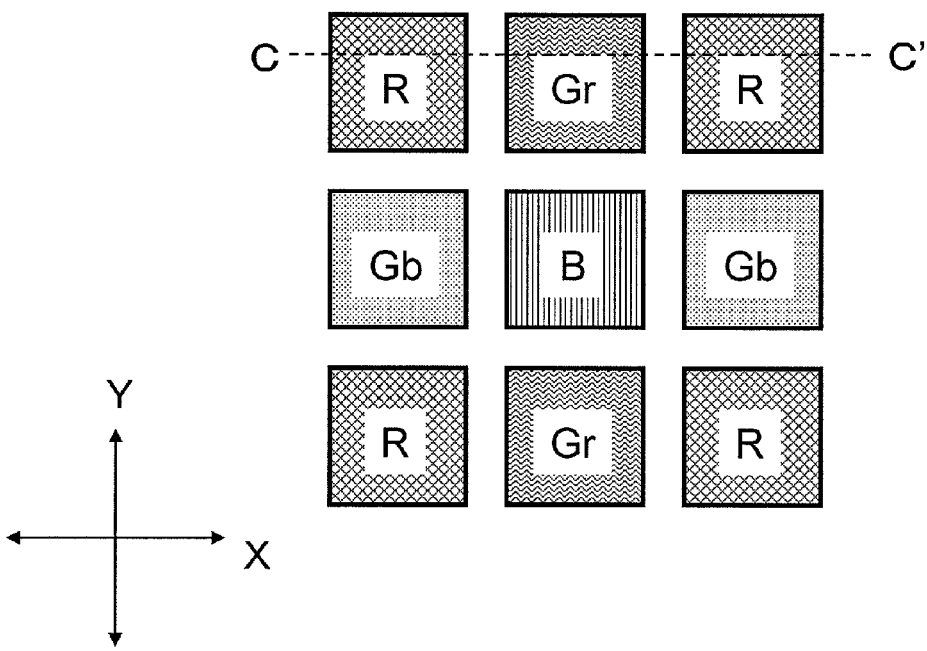
FIG. 2 illustrates an exemplary arrangement of pixels in an image sensor according to the first embodiment of the present disclosure.

Next, look at FIG. 2, which illustrates an exemplary arrangement of pixels in the image sensor 20 of the image capture device of this embodiment. In FIG. 2, the reference sign R denotes pixels that detect the intensity of the R (red) component of the incident light, the reference sign B denotes pixels that detect the intensity of the B (blue) component of the incident light, and the reference signs Gr and Gb denote pixels that detect the intensity of the G (green) component of the incident light. In the real arrangement, those pixels do not have to have such a square shape but may also be rectangular, polygonal, circular or elliptical ones. In this image sensor 20, rows in which R and G pixels are alternately arranged horizontally (which will be referred to herein as "RG rows") and rows in which G and B pixels are alternately arranged horizontally (which will be referred to herein as "BG rows") alternate vertically. In the following description, the G pixels on the RG rows will be referred to herein as "Gr pixels", while the G pixels on the BG rows will be referred to herein as "Gb rows". In the real-world image sensor 20, a huge number of pixels are arranged in columns and rows. In this embodiment, however, four adjacent pixels that are arranged in two columns and two rows form a single basic unit, and a number of such basic units are periodically arranged both horizontally and vertically. FIG. 2 illustrates only a portion of the image capturing plane. In this description, the "vertical direction" is supposed to be the direction that is parallel to the Y direction shown in FIG. 2, while the "horizontal direction" is supposed to be the direction that is parallel to the X direction shown in FIG. 2.

Figure 3:
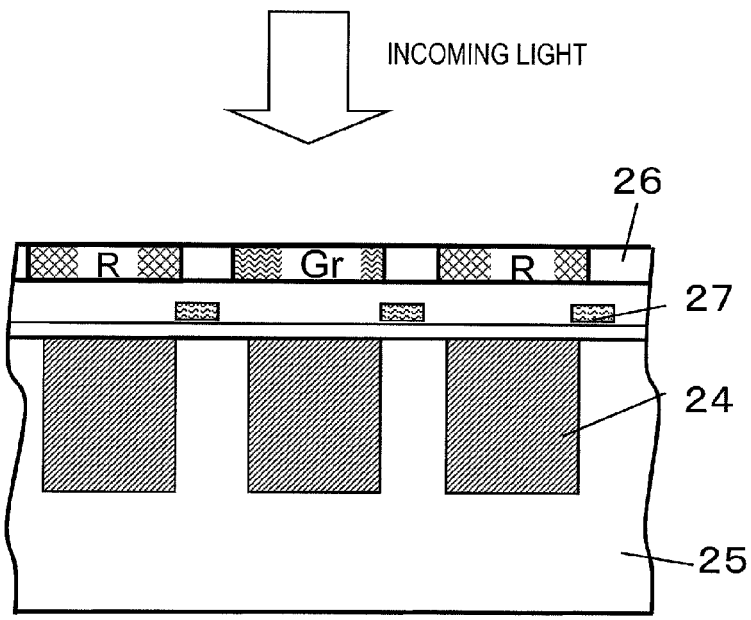
FIG. 3 is a partial cross-sectional view illustrating an exemplary configuration for the image sensor according to the first embodiment of the present disclosure.

FIG. 3 schematically illustrates a cross section of the image sensor as viewed on the plane C-C' shown in FIG. 2. In this example, an interconnect layer 27 and a color filter array 26 are stacked in this order on the light incident side of a semiconductor layer 25 in which photoelectric transducers 24 are formed. In the example illustrated in FIG. 3, the semiconductor layer 25 is thick enough to function as a self-standing substrate, and therefore, is usually called a "semiconductor substrate". The photoelectric transducers 24 have been formed by doping selected regions of the semiconductor substrate with dopant ions, which have been introduced there through the surface of the substrate.

Figure 4:
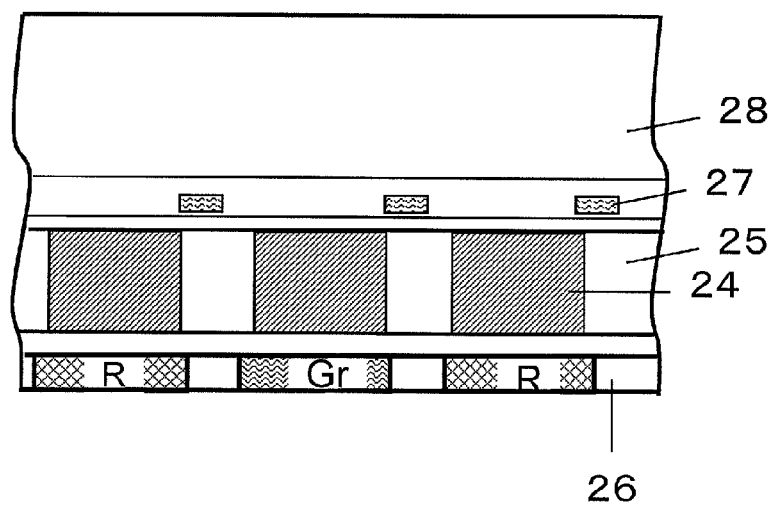
FIG. 4 is a partial cross-sectional view illustrating another exemplary configuration for the image sensor according to the first embodiment of the present disclosure.
Figure 4:

As will be described later, the present disclosure is also applicable to a solid-state image sensor of a so-called "backside illumination type". FIG. 4 schematically illustrates a cross section of the image sensor of the backside illumination type as also viewed on the plane C-C' shown in FIG. 2. In the example illustrated in FIG. 4, a color filter array 26 is arranged on the back surface of a semiconductor layer 25 in which photoelectric transducers 24 have been formed, and incoming light enters this image sensor through the back surface of the semiconductor layer 25. An interconnect layer 27 is arranged on the surface of the semiconductor layer 25 and a base member 28 is provided to support the semiconductor layer 25. In such a backside illumination type, photoelectric transducers 24 are formed by doping selected regions of the semiconductor substrate with dopant ions through its surface, and then the semiconductor substrate is partially etched from its back surface. In this manner, the semiconductor layer 25 is formed from the surface of the semiconductor substrate. The light that has entered this image sensor through the back surface of the semiconductor layer 25 can be incident on the photoelectric transducers 24 that have been formed in the semiconductor layer 25. As can be seen easily from FIG. 4, in such a solid-state image sensor of the backside illumination type, the interconnect layer 27 does not cut off the incoming light.

Figure 5:
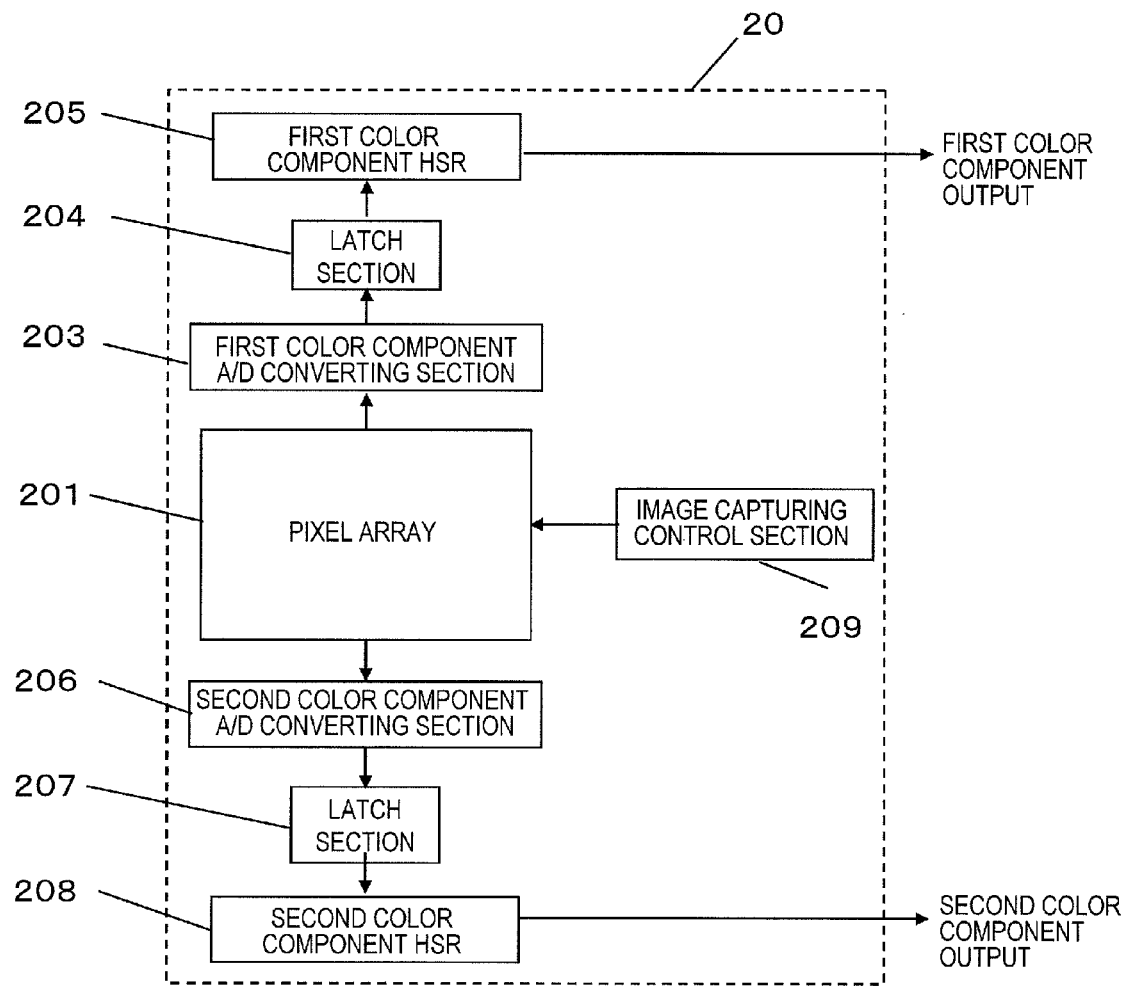
FIG. 5 is a block diagram illustrating an exemplary configuration for the image sensor according to the first embodiment of the present disclosure.

FIG. 5 is a block diagram illustrating an exemplary configuration for the image sensor 20 of this embodiment.

A pixel array 201 has a photoelectric conversion function of converting the intensity of incoming light into an electrical signal with respect to R, G and B components of a color image of the same scene. In this embodiment, the first set of color components are defined to be R and B components and the second set of color components are defined to be G components.

A first color component A/D converting section 203 performs an analog-to-digital conversion on the respective outputs of the pixel array 201. A first color component HSR (horizontal shift register) 205 receives the outputs of the A/D converting section 203 via a latch section 204, and horizontally transfers the outputs received, thereby outputting the first color component pixel signals to a device outside of this image sensor.

A second color component A/D converting section 206 performs an analog-to-digital conversion on the respective pixel output signals of the color components that have been captured by the image capturing control section 209 in a long pixel storage period and at a low frame rate. In this example, such color components that have been captured in a long pixel storage period and at a low frame rate are other than the first set of color components. A second color component HSR (horizontal shift register) 208 receives the outputs of the second color component A/D converting section 206 via a latch section 207, and horizontally transfers the outputs received, thereby outputting the pixel signals of the second color component to a device outside of this image sensor.

The latch section 204 controls the timing of inputting the digital output signals supplied from the first color component A/D converting section 203 to the first color component HSR 205. Likewise, the latch section 207 controls the timing of inputting the digital output signals supplied from the second color component A/D converting section 206 to the second color component HSR 208. An image capturing control section 209 controls the operation of the pixel array 201.

Hereinafter, it will be described in detail how these components operate.

The pixel array 201 has the R, B, Gr and Gb pixels that are arranged as shown in FIG. 2. In the pixel array of this embodiment, those pixels and signal lines are connected together differently from known ones. This point will be described in detail later. The pixel array 201 can output the respective output signals of four adjacent pixels (namely, R, B, Gr and Gb pixels), which are arranged in two columns and two rows, through the horizontal shift registers 205 and 208 to a device outside of the image sensor 20 in four parallel channels.

The first color component image is captured under a condition including a short exposure time and a high frame rate. In this embodiment, the "high frame rate" is supposed to fall within the range of approximately 30 to 60 fps (frames per second). Also, in this embodiment, the "short exposure" refers to an exposure process to be carried out within at most the upper limit of one frame period (e.g., approximately one-thirtieth to one-sixtieth second in this embodiment), which is determined by the frame rate.

The second color component image is captured under a condition including a long exposure time and a low frame rate. In this embodiment, the "low frame rate" is supposed to be a few to twenty times as low as the frame rate for a first color component. Furthermore, in this embodiment, the "long exposure" is an exposure time, of which the upper limit is one frame period that is determined by that frame rate and which is longer than the "short exposure".

It should be noted that these terms "short exposure", "long exposure", "high frame rate" and "low frame rate" have just relative meanings. That is to say, the exposure time of the first set of color components of a color image just needs to be shorter than that of the second color component, and the frame rate of the first set of color components just needs to be higher than that of the second color component. And those exposure times and frame rates do not always have to fall within the exemplary numerical value ranges defined above.

The A/D converting section 203 converts the analog pixel output signals of the first set of color components into digital ones.

The latch section 204 temporarily holds the output of the A/D converting section 203 in order to synchronize outputting the digital signals of the first set of color components from the horizontal shift register 205 to a device outside of the image sensor with outputting the digital signals of the second set of color components from the horizontal shift register 208 to a device outside of the image sensor.

The horizontal shift register 205 horizontally transfers the pixel signals of the first set of color components, which have been converted into digital signals by the A/D converting section 203, and outputs them to a device outside of the image sensor.

The second color component A/D converting section 206 converts the analog pixel output signals of the second set of color components into digital ones.

The latch section 207 temporarily holds the output of the A/D converting section 206 in order to synchronize outputting the digital signals of the second set of color components from the horizontal shift register 208 to a device outside of the image sensor with outputting the digital signals of the first color component from the horizontal shift register 205 to a device outside of the image sensor.

The horizontal shift register 208 horizontally transfers the pixel signals of the second set of color components, which have been converted into digital signals by the A/D converting section 205, and outputs them to a device outside of the image sensor.

The image capturing control section 209 outputs a control signal to the pixel array 201 and instructs the pixel array 201 to output read signals and select input signals for the A/D converting sections 203 and 206.

Figure 6:
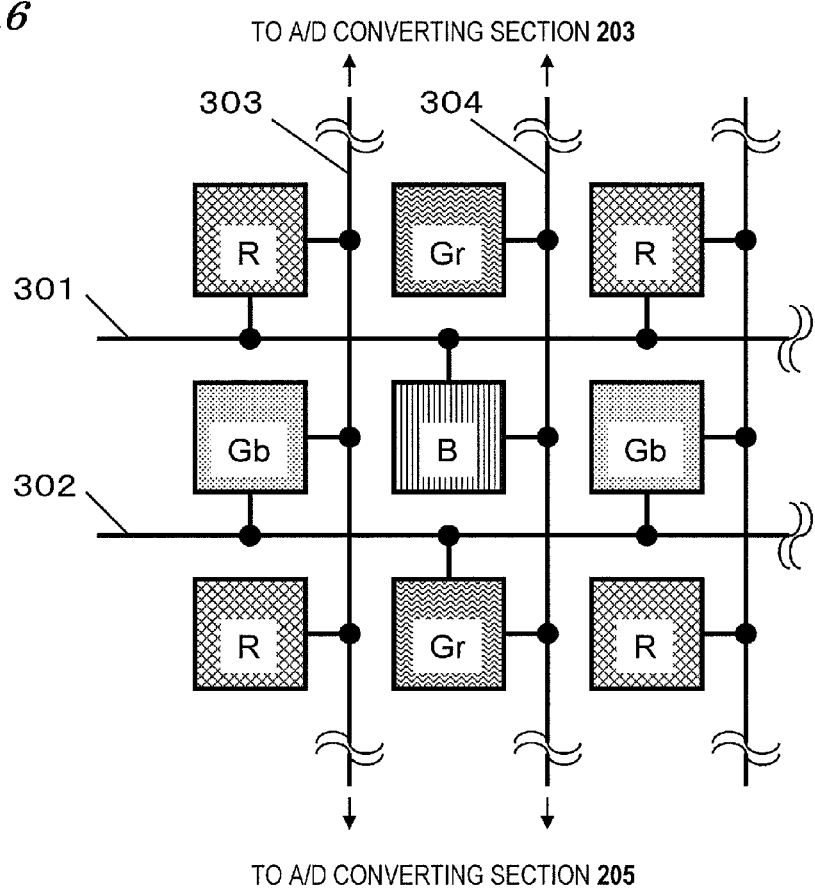
FIG. 6 illustrates how to connect read signal lines and output signal lines in a pixel array according to the first embodiment of the present disclosure.

FIG. 6 illustrates a detailed configuration for the pixel array 201.

As shown in FIG. 6, the solid-state image sensor of this embodiment includes a plurality of pixels (including R, Gr, Gb, B pixels and so on) which are arranged in columns and rows, a plurality of read signal lines 301, 302, each of which is connected to a number of pixels that are arranged in the row direction, and a plurality of output signal lines 303, 304, each of which is connected to a number of pixels that are arranged in the column direction. The color components of light rays to be incident on those pixels (including R, Gr, Gb, B pixels and so on) are adjusted by the color filter array (which is identified by the reference numeral "26" in FIGS. 3 and 4).

The read signal lines 301 and 302 are classified into a plurality of first read signal lines 301, each of which is connected to a group of pixels on which light rays with the first set of color components (R, B) are incident, and a plurality of second read signal lines 302, each of which is connected to a group of pixels on which light rays with the non-first color component (G) are incident. In the example illustrated in FIG. 6, among a plurality of pixels (including R, B, R, B, and so on) which are connected to the first type of read signal line 301 and on which light ray with the first set of color components (R, B) are incident, two pixels (R, B) on two adjacent columns are arranged on two opposite sides with respect to the first type of read signal line 301. In other words, those two pixels (R, B) form part of two different rows. On the other hand, among a plurality of pixels (including Gr, Gb, Gr, Gb, and so on) which are connected to the second type of read signal line 302 and on which light ray with the second set of color components (G) are incident, two pixels (Gr, Gb) on two adjacent columns are also arranged on two opposite sides with respect to the second type of read signal line 302. In this case, those two adjacent pixels (Gr, Gb) also form part of two different rows.

As shown in FIG. 6, the read signal line 301 is shared by the R and B pixels, and the read signal line 302 is shared by the Gr and Gb pixels. The output signal line 303 is shared by the R and Gb pixels. The output signal line 304 is shared by the B and Gr pixels. The read signal line 301 transmits R and B pixel read signals. And the read signal line 302 transmits Gr and Gb pixel read signals.

The output signal line 303 transmits the pixel output signals of the R and Gb pixels. The output signal line 304 transmits the pixel output signals of the B and Gr pixels. More specifically, the output signals of the R pixels are output upward on the paper through the output signal line 303. In the same way, the output signals of the B pixels are also output upward on the paper through the output signal line 304. The output signals of the Gr pixels are output downward on the paper through the output signal line 304 to the A/D converting section 206. In the same way, the output signals of the Gb pixels are output downward on the paper through the output signal line 303 to the A/D converting section 206, which is made up of a Gr pixel A/D converting section and a Gb pixel A/D converting section.

Figure 7:
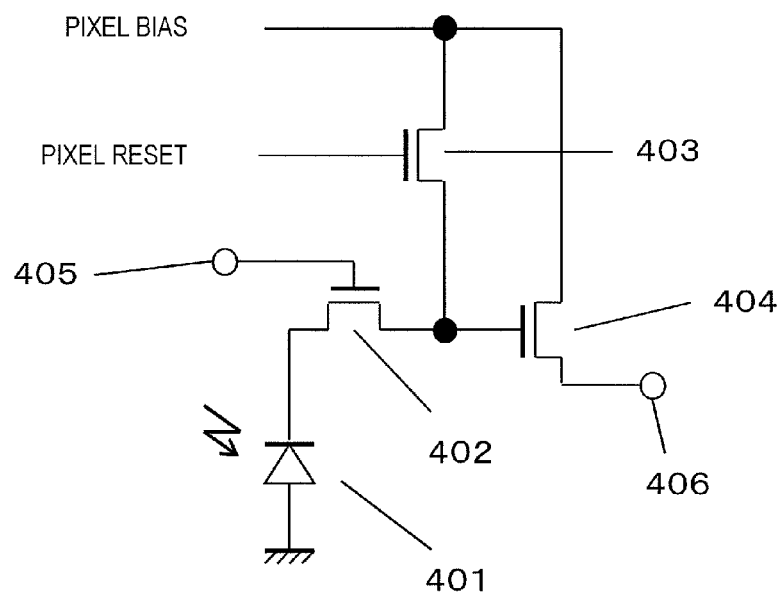
FIG. 7 illustrates an exemplary circuit representing a pixel of the image sensor 20 according to the first embodiment of the present disclosure.

Next, a read signal and a pixel output signal will be described with reference to FIG. 7, which illustrates an exemplary circuit diagram representing a pixel. A photodiode 401 converts the intensity of incident light into an electrical signal. A switch 402 outputs the electrical signal, which has been generated by the photodiode 401 through the photoelectric conversion, to an output signal line. A switch 403 performs pixel resetting. An analog buffer 404 receives the pixel output signal. The read signal is input through an input terminal 405. The output signal is output through an output terminal 406. In FIG. 7, a pixel bias signal is input to the switch 403 and the drain of the analog buffer 404. A pixel reset signal is input to the gate of the switch 403. The read signal is input to the gate of the switch 402. And the pixel output signal is output from the analog buffer 404. That is to say, the read signal is a signal indicating the timing to output the electrical signal, which has been generated by the photodiode 401 through the photoelectric conversion, to the output signal line. The pixel output signal is the electrical signal that has been generated by the photodiode 401 through the photoelectric conversion.

Figure 8A:
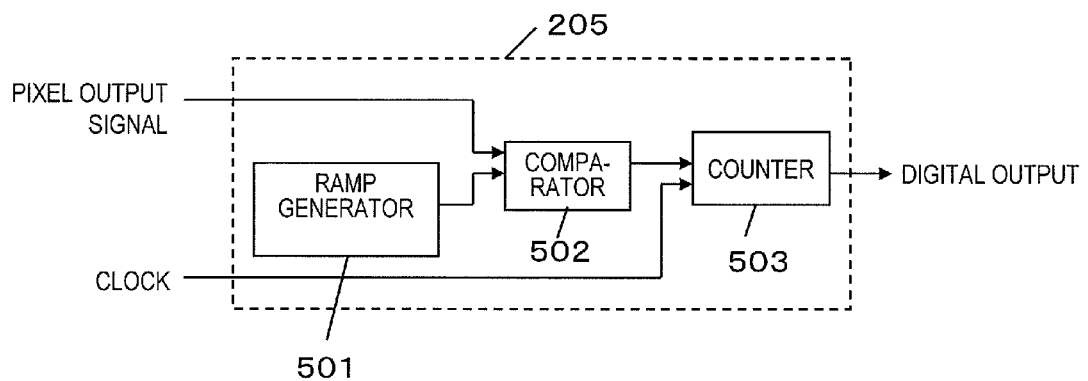
FIG. 8A illustrates an exemplary configuration for an A/D converting section in the image sensor 20 according to the first embodiment of the present disclosure.
Figure 8B:
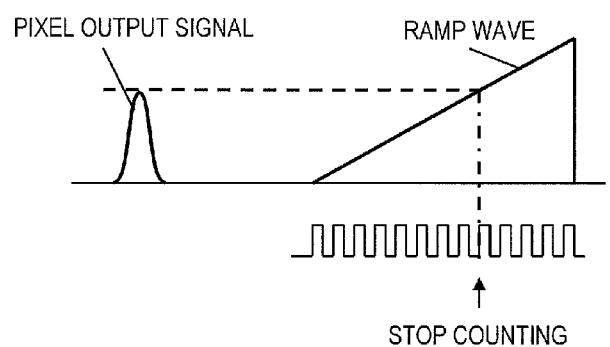
FIG. 8B illustrates how the A/D converting section operates in the image sensor 20 according to the first embodiment of the present disclosure.

The A/D converting sections 203 and 206 may have a configuration consisting of a ramp generator 501, a comparator 502 and a counter 503 as shown in FIG. 8A, for example. As shown in FIG. 8B, a ramp wave generated by the ramp generator 501 is compared to the pixel output signal, and the counter 503 is driven while the ramp wave is less than the pixel output signal. And when the ramp wave exceeds the pixel output signal, the counter is stopped and the digital value of the pixel output signal is obtained as the output of the counter.

Figure 9:
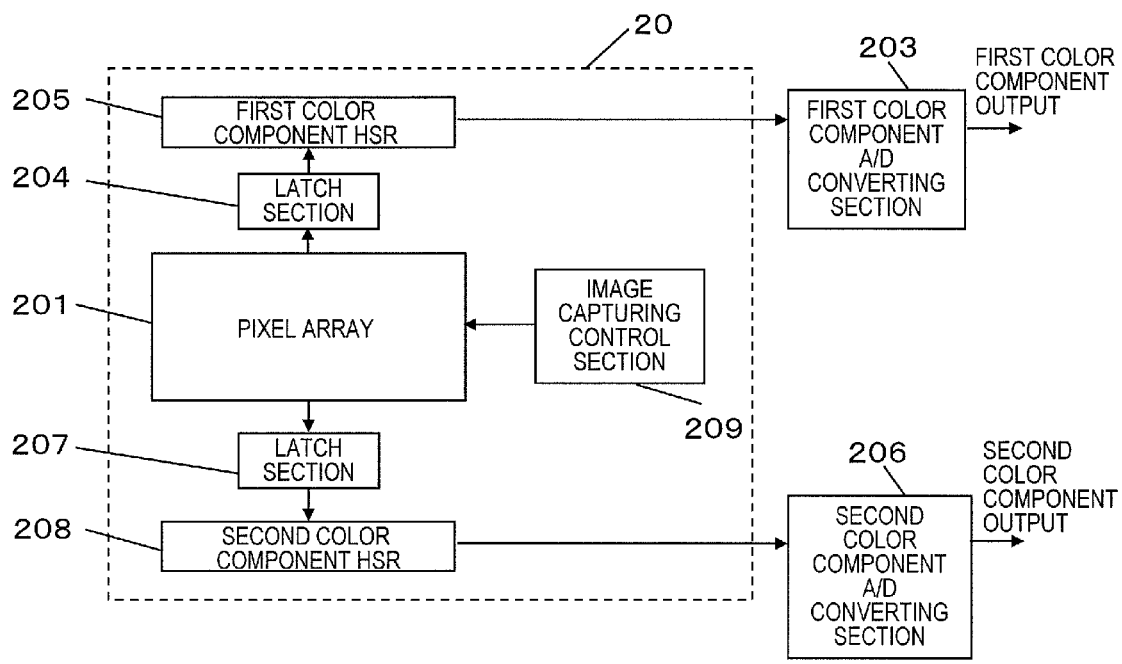
FIG. 9 is a block diagram illustrating another exemplary configuration for the image sensor according to the first embodiment of the present disclosure.

In the example illustrated in FIG. 5, the A/D converting sections 203 and 206 are arranged inside of the image sensor 20. However, the image sensor 20 may be configured to output an analog pixel signal with the A/D converting sections 203 and 206 arranged outside of the image sensor 20. FIG. 9 is a block diagram illustrating such a configuration in which the first and second color component A/D converting sections 203 and 206 are arranged outside of the image sensor 20. The image sensor of this example outputs an analog signal.

In the examples illustrated in FIGS. 5 and 9, the rate of reading R and B images from the pixel array 201 can be higher than the rate of reading G images from the pixel array 201. According to this embodiment, by capturing an image at a low rate, a sufficient quantity of light can be secured and a G image with a high SNR can be obtained. In addition, by performing binning processing, the quantity of light can also be increased when R and B images are captured at a high frame rate. Specifically, by making addition on adjacent R pixels and on adjacent B pixels, the quantities of light secured for the color component images can be increased without decreasing the frame rate of the R and B images. As a result, an image, of which the SNR is high for every color component of RGB, can be used as an input for the image processing method disclosed in the above-referenced prior art references. A high-resolution, high-frame rate color moving picture which is restored based on these input images can be a moving picture, for which an even greater quantity of light is secured and which has an even higher SNR.

It should be noted that since the pixel arrangement of this embodiment is a Bayer arrangement as shown in FIG. 6, the spatial density of G pixels in the image capturing plane is twice as high as that of the R or B pixels. Since a G image with a sufficiently high spatial resolution can be obtained according to this embodiment, the spatial resolution of the R and B images may be even less than a half as high as that of the G image. That is why by adding together the pixel signals read out from the respective R pixels in order to increase the quantity of light that can be used (i.e., by performing binning processing), the spatial resolution of the R image can be further lowered. In the same way, by adding together the pixel signals read out from the respective B pixels, the spatial resolution of the B image can be further lowered.

Figure 10:
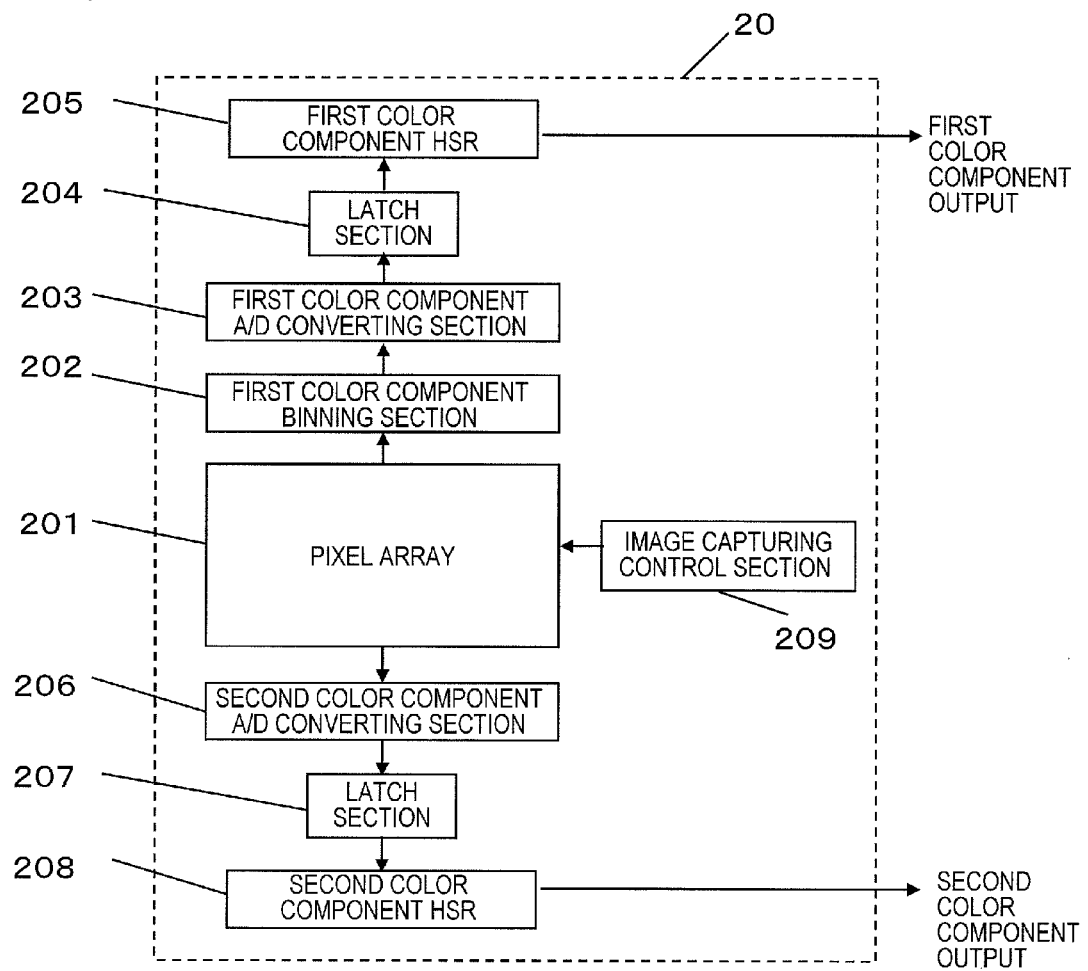
FIG. 10 is a block diagram illustrating still another exemplary configuration for the image sensor according to the first embodiment of the present disclosure.

FIG. 10 is a block diagram illustrating an exemplary configuration for a solid-state image sensor including a first color component binning section 202, which performs such binning processing. In the example illustrated in FIG. 10, the first color component binning section 202 is arranged between the pixel array 201 and the first color component A/D converting section 203. The first color component binning section 202 performs binning processing on the first color component pixel output signal that has been read out from the pixel array 201. In that case, the first color component A/D converting section 203 performs an analog-to-digital conversion on the output of the first color component binning section 202. To reduce the total amount of image data, it is beneficial to set the spatial resolution of the R and B images to be one quarter or less of that of the G image. In embodiments, the configuration shown in FIG. 10 is adopted and the spatial resolution of the R and B images is further lowered by binning.

Next, it will be described how the image capturing control section 209 operates.

Figure 11:
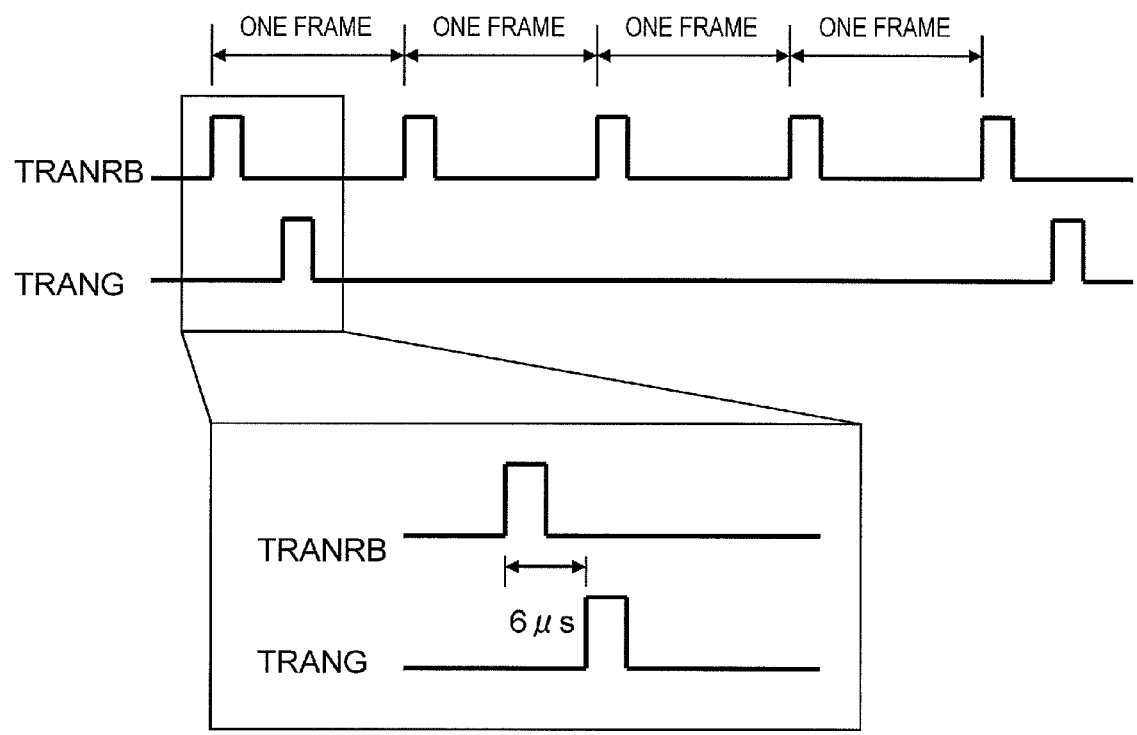
FIG. 11 shows the waveforms of read signals that are output from the image capturing control section according to the first embodiment of the present disclosure.

FIG. 11 shows the waveforms of read signals that are output from the image capturing control section 209 to the pixel array 201. TRANRB denotes the read signal of an R and/or B pixel and will be supplied to the read signal line 301. On the other hand, TRANG denotes the read signal of Gr and Gb pixels and will be supplied to the read signal line 302. In FIG. 11, shown are the waveforms of read signals to be supplied to a single pixel. The frame rate and exposure time of the R and B components are respectively four times and one quarter of those of the G component. In other words, when TRANRB rises to H level every four times, the G component read signal TRANG rises to H level once. However, the frame rate and exposure time do not have to have these values. It should be noted that one of the frame rate and the exposure time is substantially the inverse number of the other. That is to say, if the frame rate is 30 fps (frames per second), then one frame period becomes one-thirtieth second, and therefore, the exposure time also becomes approximately one-thirtieth second.

In the example shown in FIG. 11, in a frame in which TRANRB and TRANG rise to the H level, TRANG rises to the H level 6 µs later than TRANRB. However, the time lag between the time when TRANG rises to the H level and the time when TRANRB rises to the H level does not have to have that value. Instead, that time lag may be set to be as long as the time it takes for the output signal of R and B pixels to be output to the output signal lines 303 and 304 when TRANRB rises to the H level and reach the first color component A/D converting section 203 or the binning section 202 shown in FIG. 10. The lower limit of the time lag between the respective times when TRANRB and TRANG rise to the H level can be as short as the time it takes for the output of the R and B pixels to reach the first color component A/D converting section 203 shown in FIG. 5 or the binning section 202 shown in FIG. 10 and the upper limit of the time lag can be as long as the exposure time of one frame of the R and B components. The time lag may be set to be any arbitrary value as long as it falls within the range defined by these lower and upper limits.

Although the read signal TRANRB is supposed to rise to the H level earlier than the read signal TRANG in the example shown in FIG. 11, TRANG may rise to the H level earlier than TRANRB.

Next, it will be described with reference to FIGS. 12 and 13 how the pixel array 201 operates in a frame in which the read signals TRANRB and TRANG both rise to the H level. In the following example, the solid-state image sensor with the configuration shown in FIG. 10 is supposed to be taken as an example.

Figure 12:
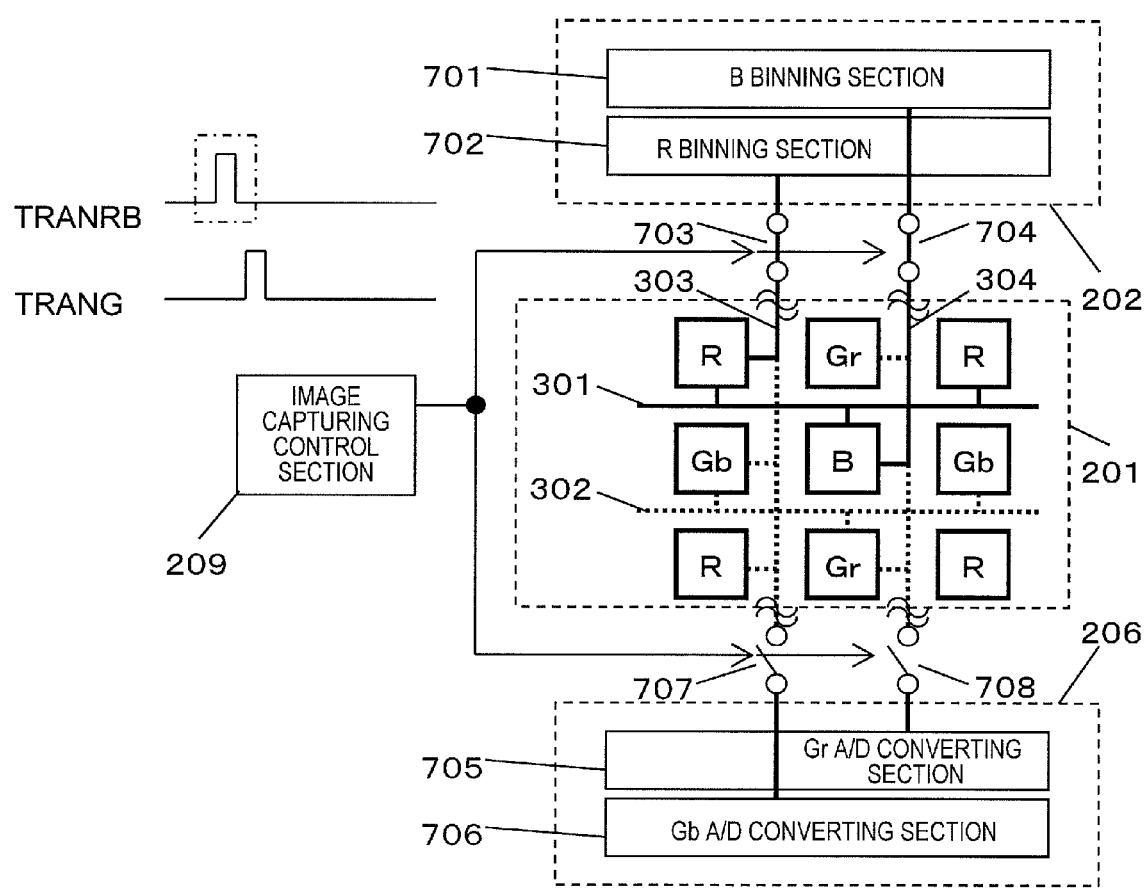
FIG. 12 illustrates conceptually how the pixel array according to the first embodiment of the present disclosure operates at a point in time when an RB component read signal is asserted.

FIG. 12 illustrates how the image capturing control section 209 and the pixel array 201 operate when TRANRB rises to the H level. Specifically, when TRANRB rises to the H level, the signal transmitted through the read signal line 301 indicated by the solid line in FIG. 12 also rises to the H level. At this point in time, the pixel output signals of R and B pixels are transmitted through the output signal lines 303 and 304, respectively. In addition, at this point in time, the image capturing control section 209 turns ON the switches 703 and 704 leading to the binning section 202. As a result, the pixel output signals of the R and B pixels are respectively transmitted to the R pixel binning section 701 and the B pixel binning section 702 in the binning section 202.

Thereafter, when the read operation in response to the previous TRANRB signal gets done on every target R and B pixels (e.g., in 6 µs in the example shown in FIG. 11), TRANG rises to the H level. FIG. 13 illustrates how the pixel array 201 operates in such a situation. Specifically, at this point in time, the pixel output signals of Gb and Gr pixels are transmitted through the output signal lines 303 and 304, respectively. In addition, at this point in time, the image capturing control section 209 turns ON the switches 707 and 708 leading to the Gr and Gb pixel A/D converting section 206. As a result, the pixel output signals of the Gr and Gb pixels are respectively transmitted to the Gr pixel A/D converting section 705 and the Gb pixel A/D converting section 706 in the A/D converting section 206.

By adopting such a configuration, even if the same output signal line is shared by a plurality of pixels, the pixel output signals of respective pixels can still be obtained without getting the output signals mixed between the pixels. More specifically, even though the ratio of the number of signal lines to the number of pixels is smaller than in the related art, the output signals of the Gb and Gr pixels, which are arranged on multiple rows, can be read in parallel with each other. In addition, the output signals of R and B pixels, which are also arranged on multiple different rows, can also be read in parallel with each other.

Figure 13:
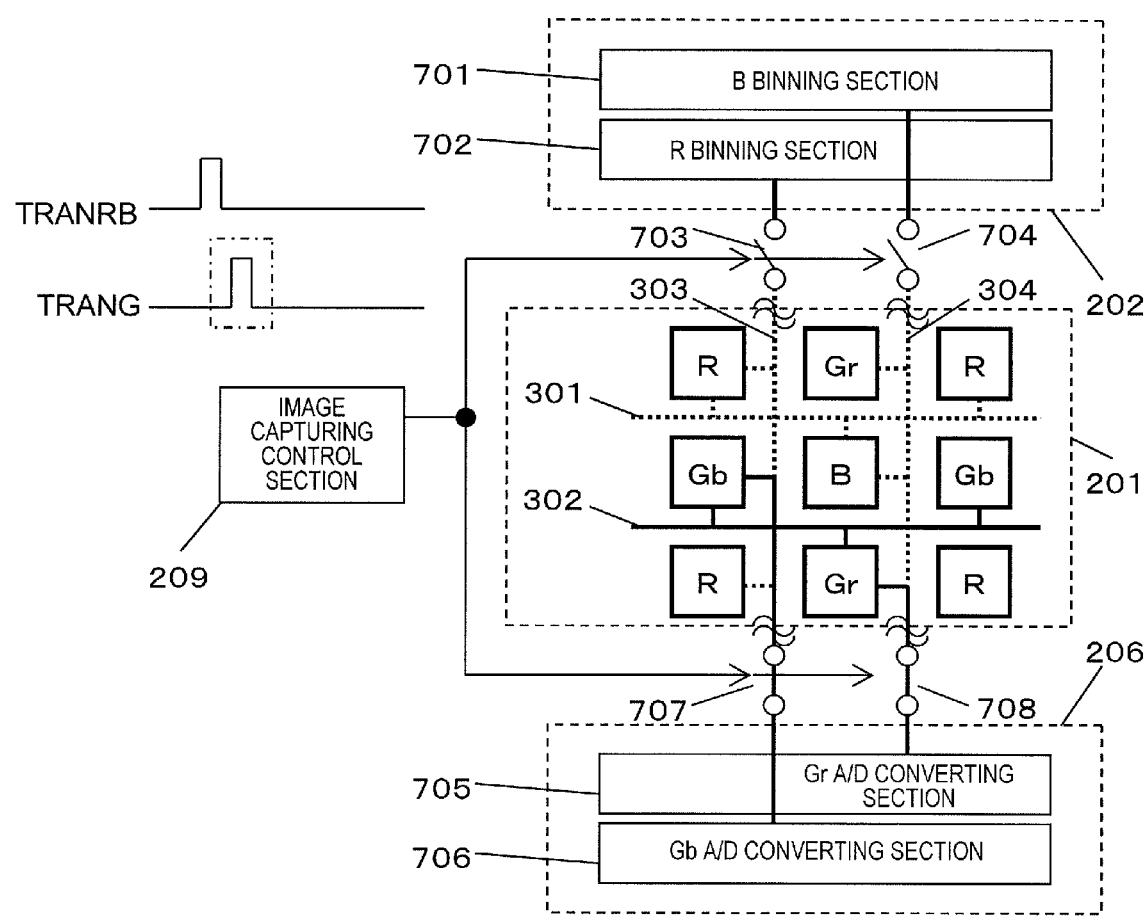
FIG. 13 illustrates conceptually how the pixel array according to the first embodiment of the present disclosure operates at a point in time when a G component read signal is asserted.

In the example illustrated in FIGS. 12 and 13, the binning section 701 including the B pixel binning section 701 and the R pixel binning section 702 is arranged over the pixel array 201, and the A/D converting section 206 including the Gr pixel A/D converting section 705 and the Gb pixel A/D converting section 706 is arranged under the pixel array 201. However, the image sensor of the present disclosure does not have to adopt this arrangement. Alternatively, the binning section 202 may be arranged under the pixel array 201 and the A/D converting section 206 may be arranged over the pixel array 201. Still alternatively, the binning section 202 and the A/D converting section 206 may be respectively arranged on the left- and right-hand sides of the pixel array.

In this embodiment, pixel signals representing the first set of color components (R, B) and pixel signals representing the second set of color components (G) are read from the pixel array 201 using mutually different circuit sections. Thus, the circuit section for reading pixel signals representing the first set of color components from the same pixel array 201 can be referred to herein as a "first reading section" and the circuit section for reading pixel signals representing the second set of color components from the same pixel array 201 can be referred to herein as a "second reading section". In the example illustrated in FIG. 10, the minimum constituting elements of the "first reading section" are the first color component binning section 202 and the first color component A/D converting section 203, while the minimum constituting element of the "second reading section" is the second color component A/D converting section 206. Optionally, the "first reading section" may further include the latch section 204, the first color component HSR (horizontal shift register) 205 and other additional components. Likewise, the "second reading section" may also include the latch section 204, the second color component HSR (horizontal shift register) 208 and other additional components.

Those latch sections 204 and 207 synchronize outputting pixel output digital signals representing the color components that have been obtained by the first reading section from the horizontal shift register 205 to a device outside of the image sensor with outputting pixel output digital signals representing the color components that have been obtained by the second reading section from the horizontal shift register 208 to a device outside of the image sensor. As described above, in a configuration in which the read signals are output at different timings between the R, B components and G components, there is a time lag between a point in time when the pixel output signals of the R and B components reaches the binning section 202 from the pixel array 201 and a point in time when the pixel output signals of the G components (Gr and Gb) reaches the A/D converting section 206 from the pixel array 201. However, outputting the color-by-color pixel signals may be synchronized when the signals are output from the horizontal shift registers 205 and 208 to a device outside of the image sensor 20, and the flow of the pixel output signals inside of the image sensor may be timed arbitrarily. In any case, by adopting such a configuration in which the latch sections 204 and 207 synchronize outputting the pixel output signal before those pixel output signals representing the respective color components are output to a device outside of the image sensor 20, there is no time lag between the pixel output signals of the same color when output from this image sensor 20.

In the examples illustrated in FIGS. 5, 9 and 10, the latch sections 204 and 207 are arranged behind the A/D converting sections 203 and 206, respectively, and the timing adjustment is made when the pixel output signals are converted into digital signals. However, the latch sections 204 and 207 do not always have to be arranged there. Alternatively, the latch sections 204 and 207 may also be arranged just before the A/D converting sections 203 and 206 and may be configured to hold analog signals. In that case, a capacitor may be added to the input terminal of the A/D converting sections 203 and 206 and the image sensor may be configured so that it is not until the binned pixel output signal obtained by the first reading section and the pixel output signal obtained by the second reading section are both held in the capacitor that those pixel output signals are passed to the A/D converting sections 203 and 206.

Figure 14:
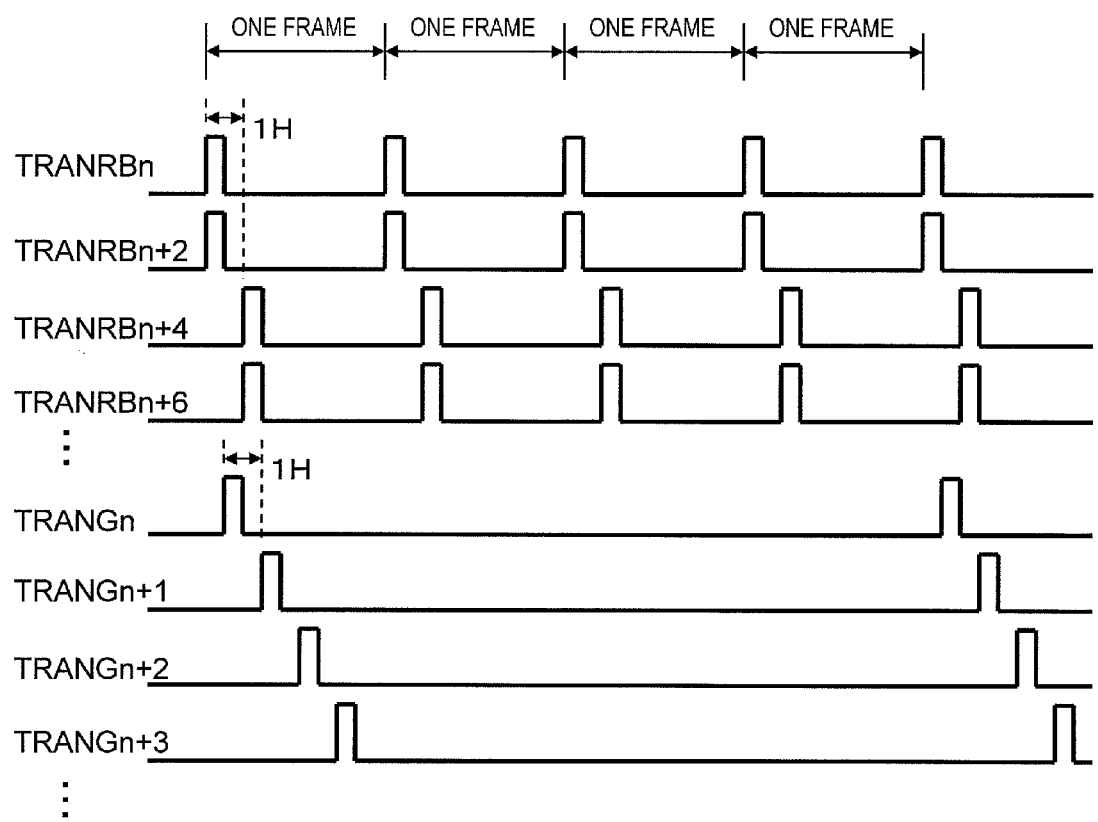
FIG. 14 shows the signal waveforms of read signals that are output from an image capturing control section and supplied to multiple horizontal pixel arrangements in the first embodiment of the present disclosure.

Next, it will be described with reference to FIG. 14 how the binning section 202 operates. FIG. 14 shows exemplary waveforms of read signals to be output from the image capturing control section 209 when 2×2 adjacent pixels are supposed to be added together. Take R pixels as an example and suppose that R pixels on $n^{th}$ and $(n+2)^{th}$ rows as counted vertically are added together, R pixels on $(n+4)^{th}$ and $(n+6)^{th}$ rows are also added together, and then R pixels on two adjacent rows will be added together after that. In the pixel array 201 of this embodiment, R pixels are arranged on every other row as shown in FIG. 6, and therefore, R pixels adjacent to R pixels on the $n^{th}$ row are arranged on the $(n+2)^{th}$ row. FIG. 14 shows the read signals of the R pixels. In FIG. 14, TRANRBn, TRANRBn+2, TRANRBn+4, and TRANRBn+6 denote the read signals supplied to R pixels on the $n^{th}$, $(n+2)^{th}$, $(n+4)^{th}$ and $(n+6)^{th}$ rows, respectively. Also, in FIG. 14, each period identified by 1H corresponds to one horizontal scanning period. As shown in FIG. 14, TRANRBn and TRANRBn+2 rise to the H level at the same time, so do TRANRBn+4 and TRANRBn+6. By applying read signals from such two adjacent rows to two read signal lines 301 (see FIG. 6) at the same time in this manner, pixel values are added together vertically on the output signal line 303 (see FIG. 6). Since G pixels are arranged on every row, read signals are supplied to those G pixels on every row at regular intervals of one horizontal scanning period (1H) as shown on the lower half of FIG. 14.

Figure 15:
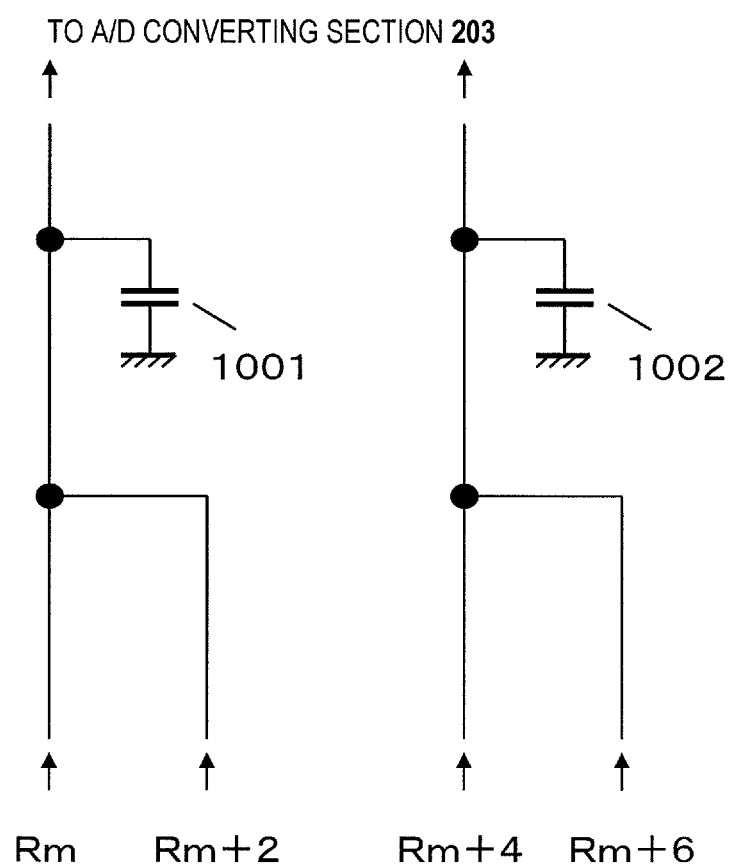
FIG. 15 is circuit diagram illustrating an exemplary configuration for a binning section according to the present disclosure.

FIG. 15 illustrates a configuration for making an addition on R pixels on the same row (i.e., an RB row), which form part of an $m^{th}$ column and an $(m+2)^{th}$ column, respectively, and on R pixels on the same row, which form part of an $(m+4)^{th}$ column and an $(m+6)^{th}$ column, respectively. Although not shown in FIG. 15, the binning section 202 has the same configuration for any other pair of two adjacent R pixels on the same row (i.e., an RB row).

As in adding the values of vertically adjacent pixels, since the R pixels are arranged every other column horizontally, the pixel binning section 202 adds together the signals of R pixels on $m^{th}$ and $(m+2)^{th}$ columns and also adds together the signals of R pixels on $(m+4)^{th}$ and $(m+6)^{th}$ columns. In FIG. 15, Rm, Rm+2, Rm+4 and Rm+6 denote pixel output signals of R pixels on the $m^{th}$, $(m+2)^{th}$, $(m+4)^{th}$ and $(m+6)^{th}$ columns, respectively. By charging the capacitor 1001 with both of the pixel output signals Rm and Rm+2 and the capacitor 1002 with both of the pixel output signals Rm+4 and Rm+6, the values of horizontally adjacent pixels can be added together. Addition can be made in the same way on B pixels, too.

The binning section 202 may be arranged either before the A/D converting section 203 as shown in FIG. 10 or after the A/D converting section 203. If the binning section 202 is arranged before the A/D converting section 203, binning is performed first, and then A/D conversion is performed next. On the other hand, if the binning section 202 is arranged after the A/D converting section 203, then binning is carried out by adding together the A/D converted digital signals. The binning section 202 may be arranged either in the image sensor 20 as shown in FIG. 10 so that the binning operation is performed inside of the image sensor 20 or outside of the image sensor 20 so that the binning operation is performed outside of the image sensor 20.

Figure 16:
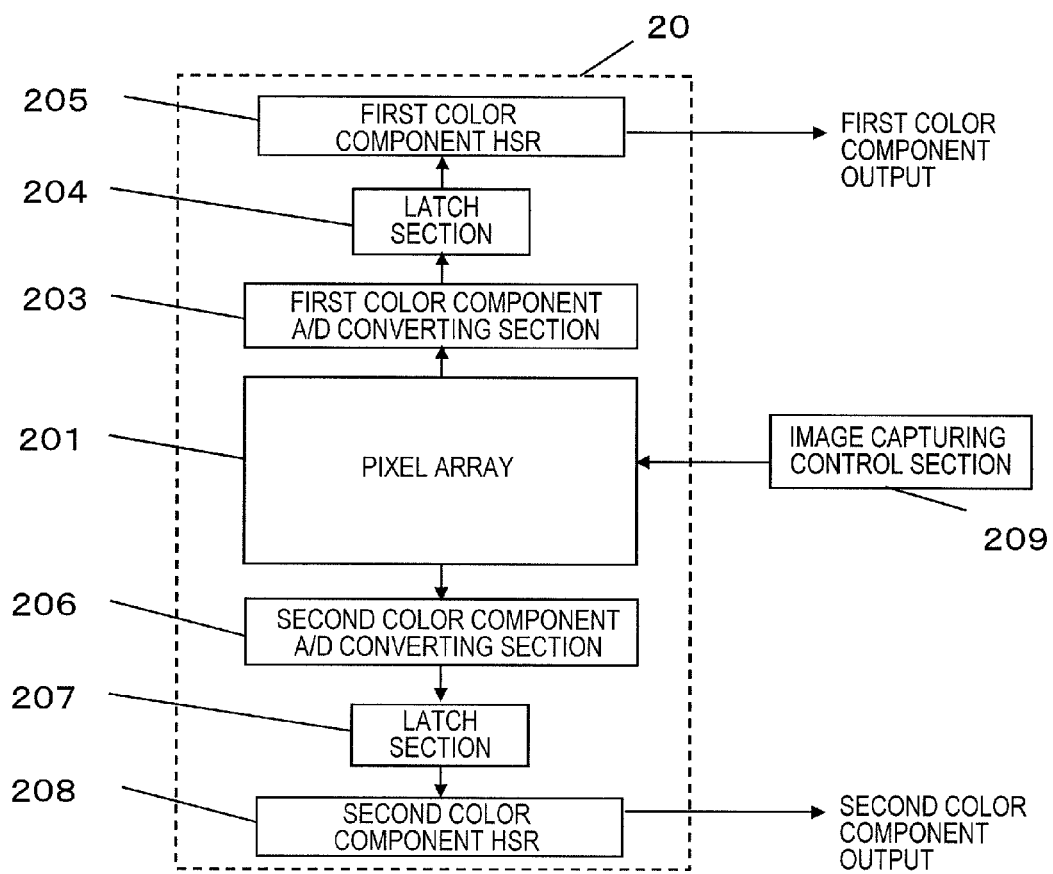
FIG. 16 is a block diagram illustrating yet another exemplary configuration for the image sensor according to the first embodiment of the present disclosure.

The image capturing control section 209 may be arranged inside of the image sensor 20 as shown in FIGS. 5 to 2C so as to generate the read signals and the switch control signals inside of the image sensor 20. Or the image capturing control section 209 may also be arranged outside of the image sensor 20 as shown in FIG. 16. If the image capturing control section 209 is arranged outside of the image sensor, the image capturing control section 209 supplies the read signals and switch control signal from outside of the image sensor 20.

Optionally, in the configuration of this embodiment, an on-chip micro lens may be arranged on each pixel in order to further increase the ability to condense the incoming light.

Next, an effect to be achieved by this embodiment will be described with reference to FIGS. 17A and 17B.

Figure 17A:
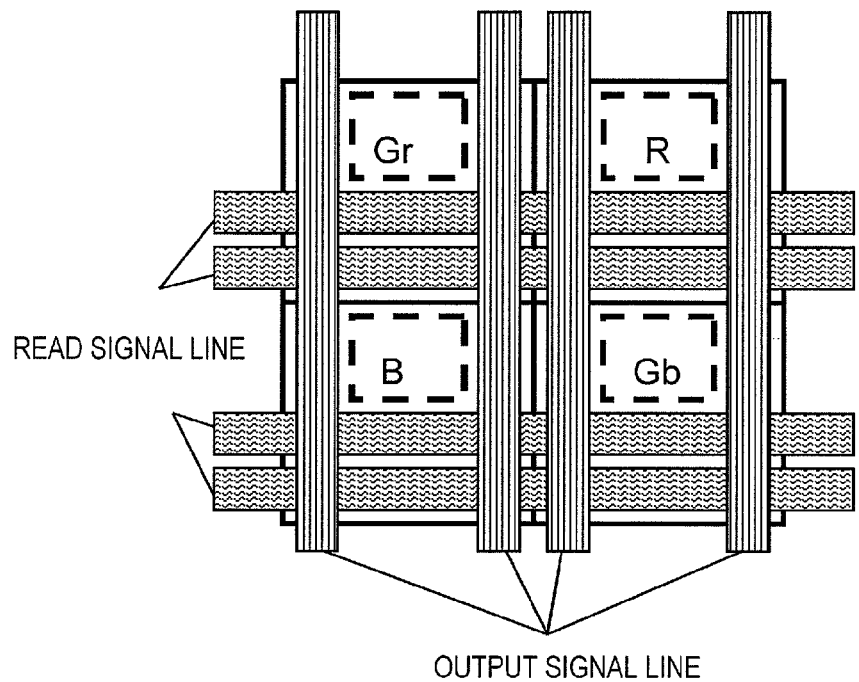
FIG. 17A illustrates the areas occupied by lines in a known arrangement.
Figure 17B:
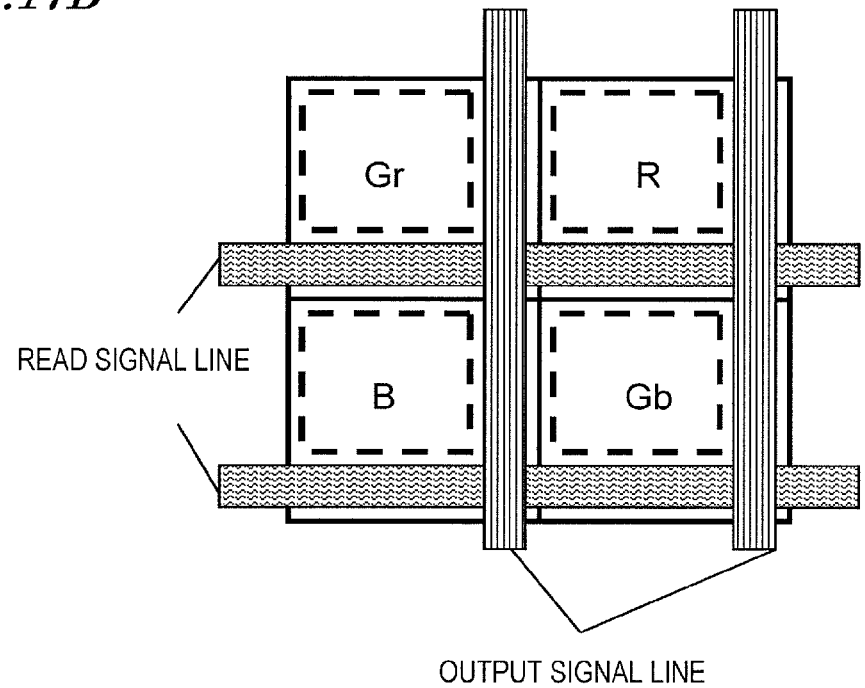
FIG. 17B illustrates the areas occupied by lines in the first embodiment of the present disclosure.

FIG. 17A illustrates a known arrangement, while FIG. 17B illustrates the arrangement of this embodiment. In FIGS. 17A and 17B, the bold dashed lines indicate the apertures of pixels. By adopting the arrangement of this embodiment, each aperture can have a larger area than in the known arrangement. For example, if the apertures have a size of 2.5 μm×2.5 μm the read signal lines have a width of 0.23 μm, and the output signal lines have a width of 0.26 μm in the known arrangement, the aperture area of each pixel can be increased by approximately 21% by adopting the arrangement shown in FIG. 17B.

Figure 18:
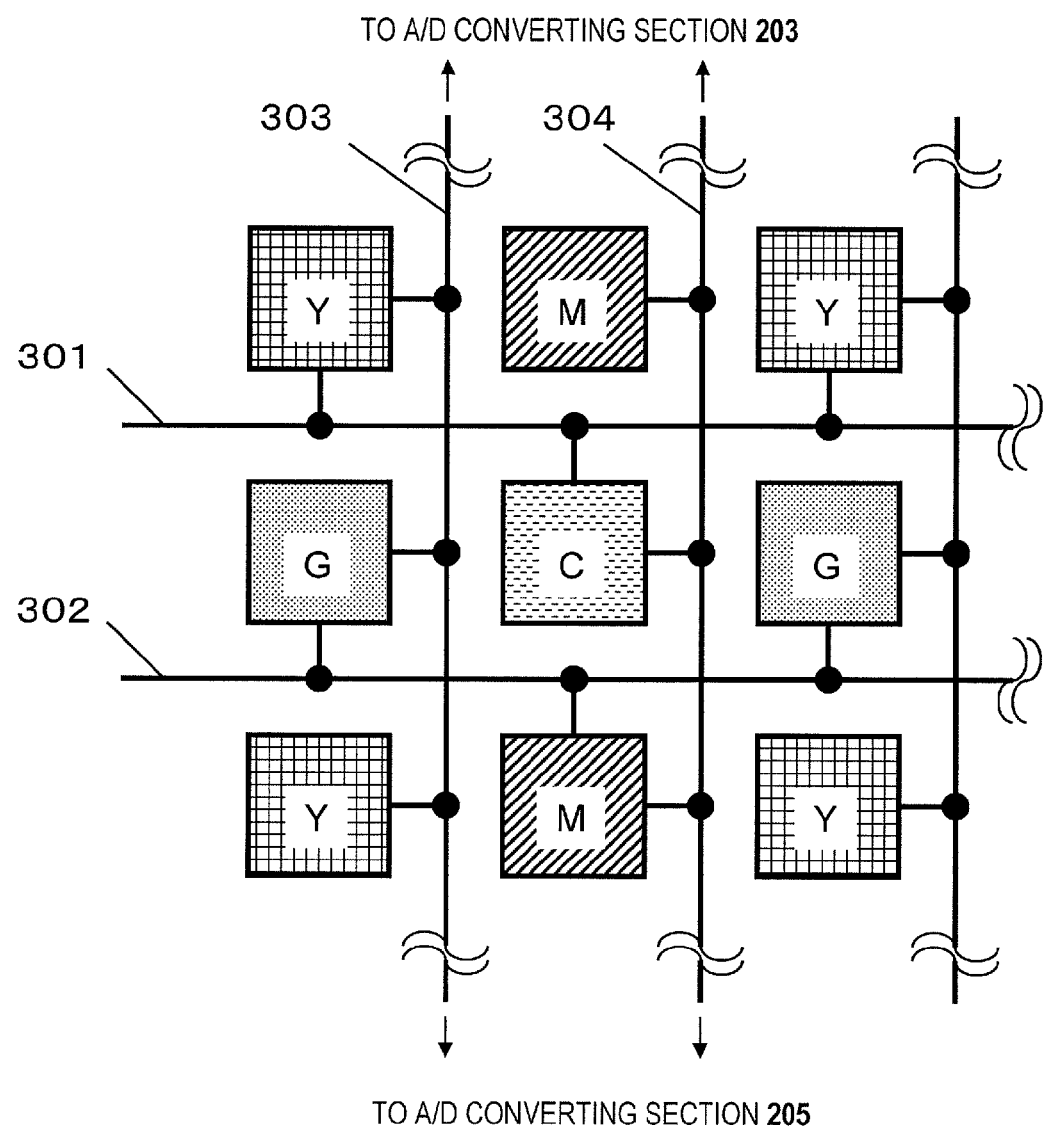
FIG. 18 illustrates another exemplary pixel arrangement that may be adopted according to the present disclosure.

FIG. 18 illustrates another pixel arrangement according to this embodiment. In this pixel arrangement, an image can be captured with respect to the color components of cyan (C), magenta (M), yellow (Y) and G. In this case, Y, C, M and G pixels may be arranged where the R, B, Gr and Gb pixels are arranged in FIG. 6. By adopting such an arrangement, images representing Y and C components can be obtained at a relatively high frame rate (i.e., in a short exposure time) and images representing M and G components can be captured at a relatively low frame rate (i.e., in a long exposure time). In this example, the first set of color components are Y and C, while the second set of color components are M and G.

In this embodiment, the color components represented by the pixel output signals to be obtained by the first reading section are supposed to be R and B components, while the color components represented by the pixel output signals to be obtained by the second reading section are supposed to be G components. However, the image capture device of the present disclosure does not have to adopt this allocation. Also, the pixel array 201 is supposed to have a pixel arrangement in which R and G pixels are alternately arranged horizontally and in which B and G pixel are alternately arranged horizontally. However, the image sensor of this embodiment does not always have to have such a pixel arrangement. By adopting the configuration of this embodiment, in an image capture device including a single-panel color image sensor which change frame rates on a color component basis and which outputs in parallel the output signals of multiple pixels that cover multiple rows or columns, even if the pixels have a very small size, a sufficiently large aperture area can still be secured for each pixel and the sensitivity of shooting can be increased as well.

Embodiment 2

Hereinafter, a second embodiment of an image sensor according to the present disclosure will be described.

The image sensor of the present disclosure is also applicable to a backside illumination type image sensor, of which the interconnect layer is arranged opposite to the light incident side (as in the sensor shown in FIG. 4). In the embodiment to be described below, the connection between the pixels and the signal lines described above is applied to a backside illumination type image sensor.

Figure 19:
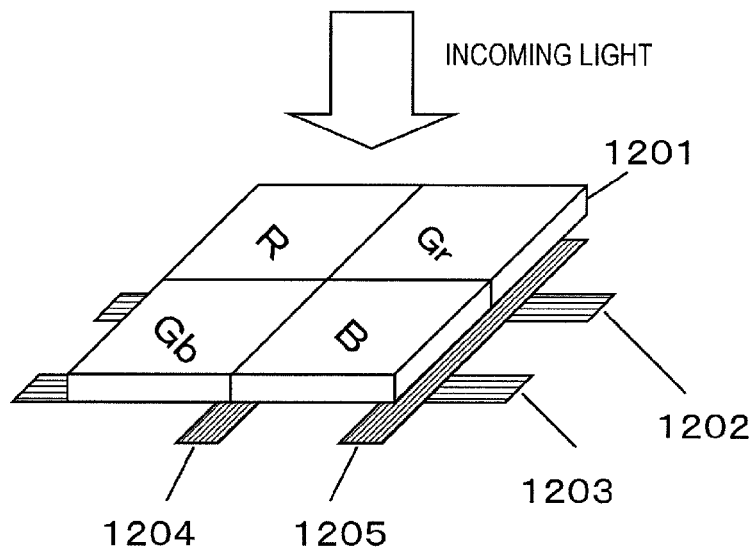
FIG. 19 is a perspective view illustrating a general arrangement for an image sensor as a second embodiment of the present disclosure.
Figure 20:
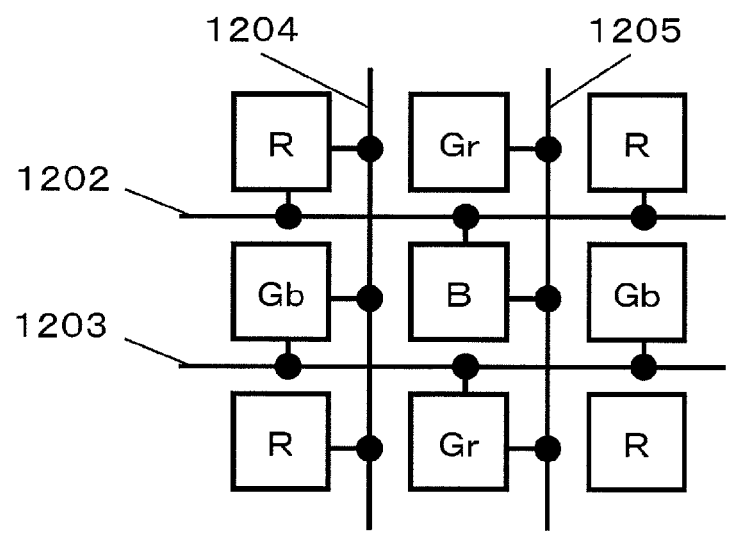
FIG. 20 illustrates how to connect read signal lines and output signal lines in a pixel array of the image sensor according to the second embodiment of the present disclosure.

FIG. 19 is a perspective view schematically illustrating how the basic arrangement of pixels is provided with respect to the signal lines in an image sensor according to this embodiment. FIG. 20 illustrates how to connect the pixels and the signal lines together in this embodiment.

As shown in FIG. 19, no signal lines are provided on the light incident surface of pixels 1201 (i.e., on the back surface of the image sensor), thereby increasing the aperture ratio of each pixel. On the other side of the image sensor opposite to the light incident surface (i.e., on the wiring side), arranged are a read signal line 1202 which supplies read signals to the R and B pixels and a read signal line 1203 which supplies read signals to the Gr and Gb pixels. In addition, also arranged on the wiring side are an output signal line 1204 which transmits the pixel output signals of the R and Gb pixels and an output signal line 1205 which transmits the pixel output signals of the B and Gr pixels.

As shown in FIG. 20, respective pixels and signal lines are connected together in this embodiment in the same way as the respective pixels and signal lines in the embodiment that has already been described with reference to FIG. 6. Also, in this embodiment, read signals may be supplied to the respective pixels and output signals may be obtained from those pixels in quite the same way as in the first embodiment. That is to say, the read signal line 1202 is shared by R and B pixels, which both captures an image using the first reading section, and the read signal line 1203 is shared by Gr and Gb pixels, which both captures an image using the second reading section. Meanwhile, the output signal line 1204 is shared by R and Gb pixels, which captures an image using the first and second reading sections, respectively, and the output signal line 1205 is shared by B and Gr pixels, which captures an image using the first and second reading sections, respectively.

As for the read signals supplied to the read signal lines 1202 and 1203, in a frame in which pixel output signals are obtained from both of those pixels that get outputs using the first and second reading sections, the timings of the read signals are shifted by 6 μs as in the example shown in FIG. 11. At the same time, synchronously with those read signals, turned are the switches leading to the binning section for the pixels that get output signals using the first reading section and the A/D converting section for the pixels that get output signals using the second reading section.

In this embodiment, a single read signal line 1202 or 1203 is provided for each row of pixels, and a single pixel output signal line 1204 or 1205 is provided for each column of pixels. That is why since the line widths of those signal lines 1201 through 1205 can be broader than ordinary ones, the wiring resistance of those signal lines 1201 through 1205 can be reduced.

Embodiment 3

Hereinafter, a third embodiment of an image sensor according to the present disclosure will be described with reference to FIGS. 21A through 21D.

In this embodiment, pixels are arranged differently in the pixel array 201 from in the embodiments described above. Other than that, however, this embodiment also has the same configuration as any of the embodiments described above.

In the example illustrated in FIG. 14A, GS pixels are arranged in the pixel array 201 of the first embodiment at B pixel locations of the color filter arrangement (see FIG. 6) and R and B pixels are arranged alternately at R pixel locations. Also, GL pixels are arranged at Gr and Gb pixel locations.

In this description, the "GS pixel" refers herein to a G pixel, from which a pixel signal is obtained at the frame rate of the first color component, while the "GL pixel" refers herein to a G pixel, from which a pixel output signal is obtained at a lower frame rate that that of the first color component. In the configuration shown in FIG. 6, an image is captured at every G pixel using the second reading section (i.e., by an image capturing method that requires the longer exposure time). On the other hand, in the configuration shown in FIG. 14A, an image is captured at some G pixels using the first reading section (i.e., by an image capturing method that requires the shorter exposure time).

Figure 21A:
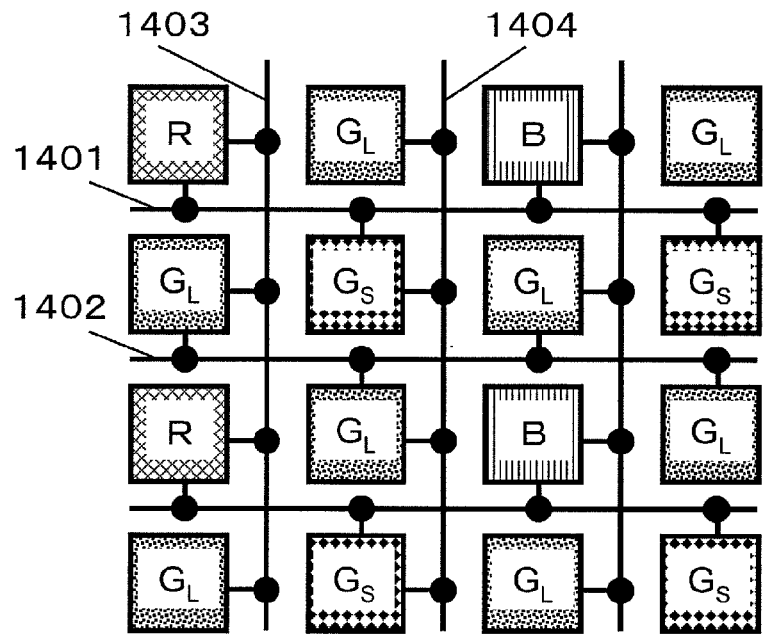
FIG. 21A illustrates still another exemplary pixel arrangement that may be adopted according to the present disclosure.
Figure 21B:
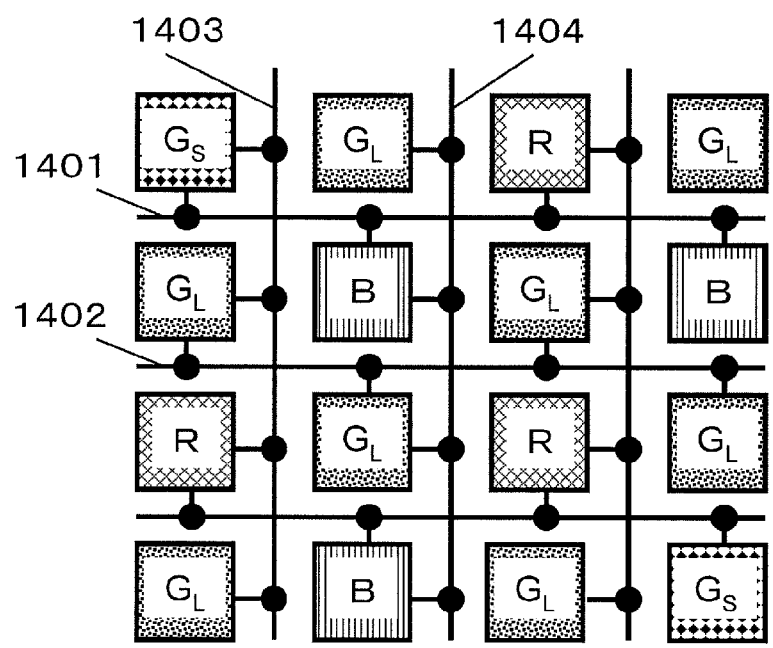
FIG. 21B illustrates yet another exemplary pixel arrangement that may be adopted according to the present disclosure.
Figure 21C:
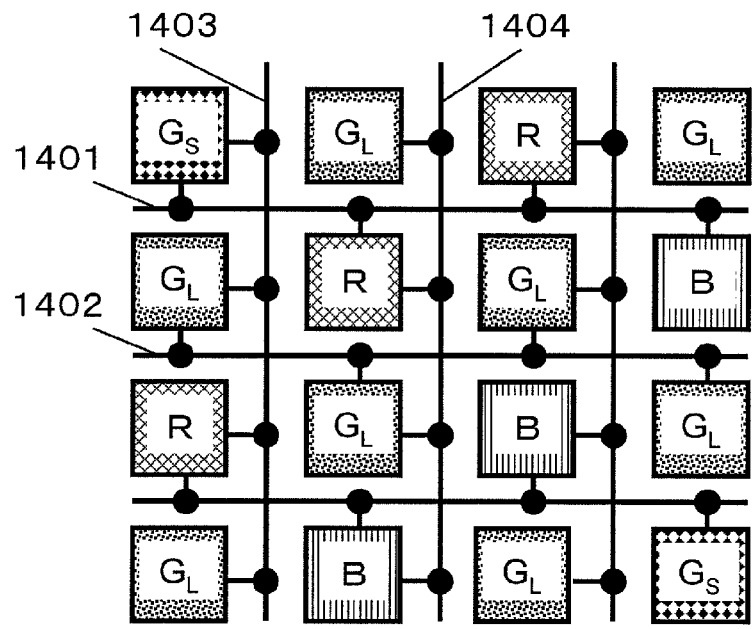
FIG. 21C illustrates yet another exemplary pixel arrangement that may be adopted according to the present disclosure.
Figure 21D:
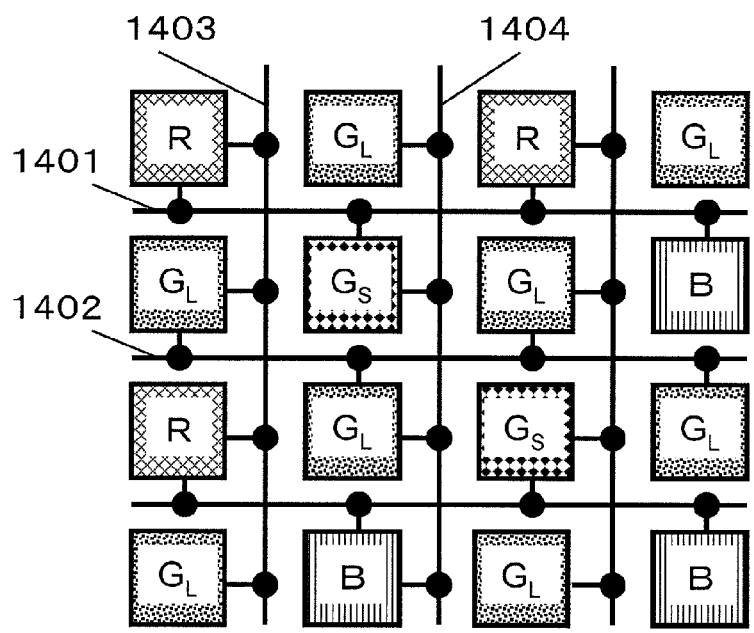
FIG. 21D illustrates yet another exemplary pixel arrangement that may be adopted according to the present disclosure.

FIGS. 21B, 21C and 21D illustrate alternative arrangements of the GL and GS pixels on the pixel array. In these drawings, the reference numerals 1401 and 1402 denote read signal lines, and the reference numerals 1403 and 1404 denote output signal lines. In each of these arrangements shown in FIGS. 21A through 21D, each read signal line is shared by pixels to be read at the same frame rate and each output signal line is shared by pixels to be read at mutually different frame rates as in the first embodiment.

Even if an image is captured with those G pixels with the longer exposure time and those G pixels with the shorter exposure time mixed in the same pixel array, the aperture area of each pixel and the shooting sensitivity can be increased no less effectively than in the first embodiment described above. It should be noted that by mixing such G pixels with the longer exposure time and such G pixels with the shorter exposure time, the blur of a G component image, which has been captured through the long exposure process in order to increase the resolution and frame rate of a color moving picture, can be reduced by reference to not only information about the R and B components that require the shorter exposure process but also information about the G component image in the same color as well. As a result, the performance of the resolution and frame rate increasing processing can be improved.

In each of the embodiments described above, each row of pixels and each column of pixels run straight. However, each row of pixels or each column of pixels may run in a zigzag pattern as well.

Figure 22:
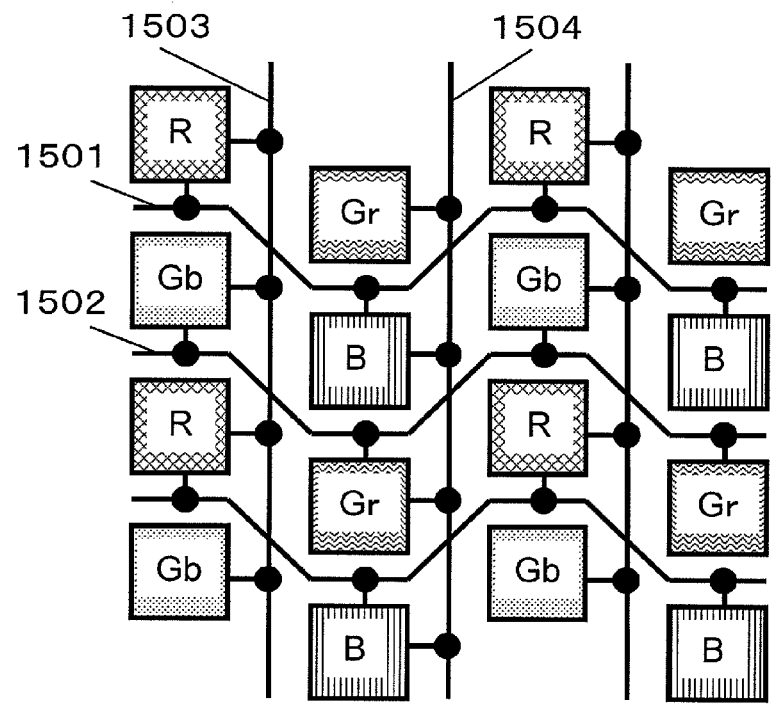
FIG. 22 illustrates yet another exemplary pixel arrangement that may be adopted according to the present disclosure.
Figure 23:
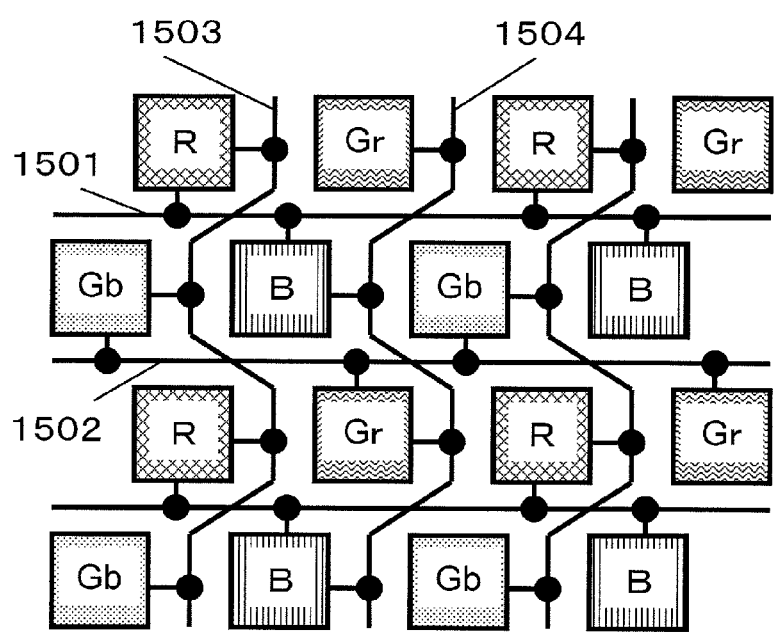
FIG. 23 illustrates yet another exemplary pixel arrangement that may be adopted according to the present disclosure.

FIG. 22 illustrates an exemplary arrangement of a pixel array in which each row of pixels runs in a zigzag pattern. FIG. 23 illustrates an exemplary arrangement of a pixel array in which each column of pixels runs in a zigzag pattern. In the example shown in FIG. 22, two pixels belonging to two adjacent columns of pixels are vertically shifted from each other by a half pixel pitch. On the other hand, in the example shown in FIG. 23, two pixels belonging to two adjacent rows of pixels are horizontally shifted from each other by a half pixel pitch. Even if each row or column of pixels runs in such a zigzag pattern, those pixels will also be regarded herein as being arranged in columns and rows.

Even in the examples illustrated in FIGS. 22 and 23, the respective pixels and signal lines are also connected just as already described for the first embodiment with reference to FIG. 6. Consequently, the same effects as those of the first embodiment described above can also be achieved.

Figure 24:
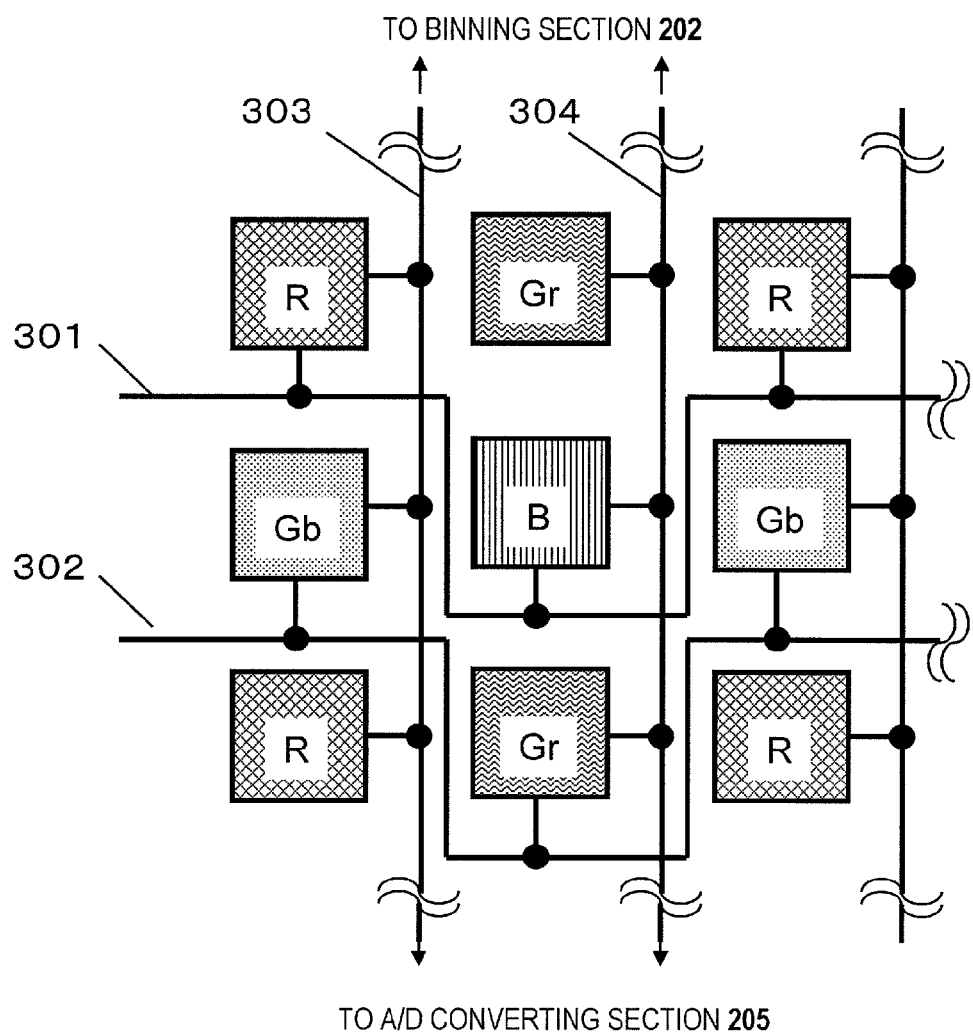
FIG. 24 illustrates yet another exemplary pixel arrangement that may be adopted according to the present disclosure.
Figure 25:
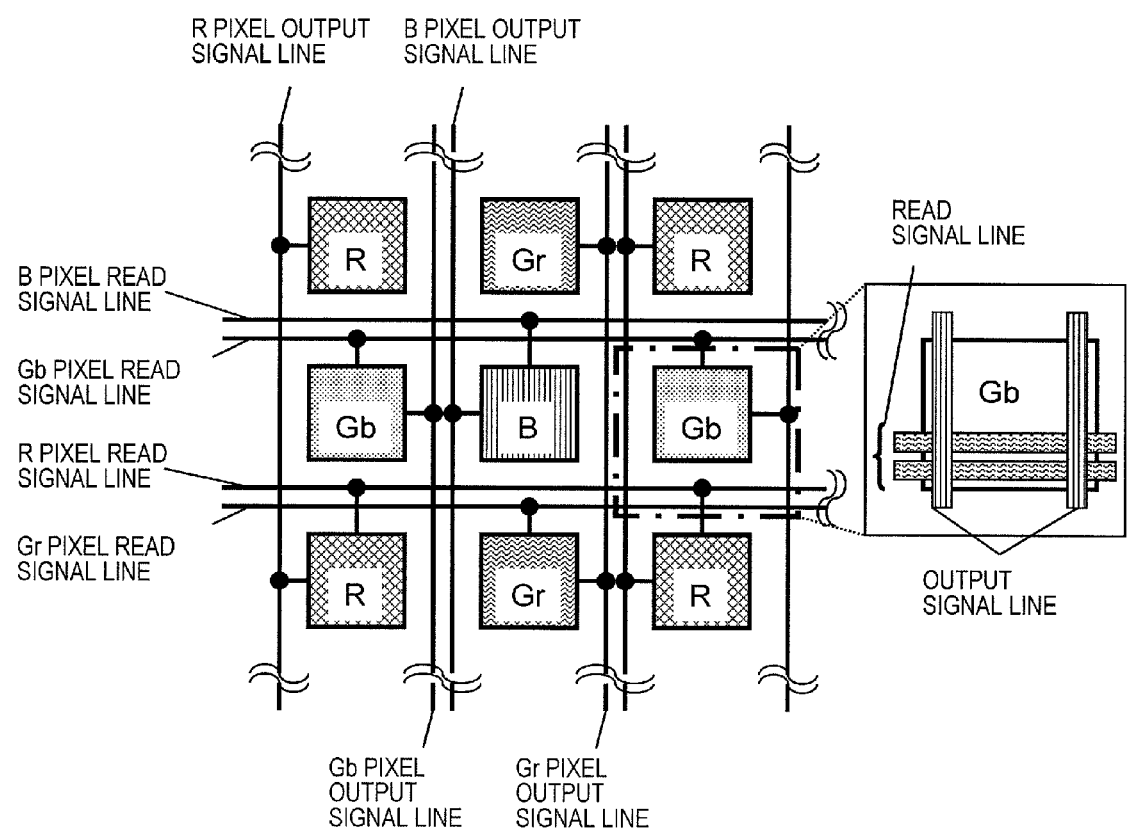
FIG. 25 Illustrates how to connect read signal lines and output signal lines in a single-panel image sensor of the related art.

FIG. 24 illustrates another exemplary pixel array arrangement in which first and second read signal lines 301 and 302 are bent. In this example, the (R, B) pixels that are connected to the first type of read signal line 301 are arranged on the same side with respect to the first type of read signal line 301 (i.e., on the upper side on the paper in the example illustrated in FIG. 24). Likewise, the (Gr, Gb) pixels that are connected to the second type of read signal line 302 are also arranged on the same side with respect to the second type of read signal line 302 (i.e., on the upper side on the paper in the example illustrated in FIG. 24). Although such a wiring pattern is different from the one shown in FIG. 6, two adjacent pixels connected to each read signal line 301, 302 also form part of two different rows as in the first embodiment described above.

A typical device including the solid-state image sensor of any of the embodiments described above (such as an image capture device) may have a built-in microcomputer inside or outside of the system controller 160 as shown in FIG. 1 and can perform a read operation with the frame rate changed on a color component basis in accordance with a computer program. That is to say, the processing step of outputting first color component (e.g., R and B) image data through the output signal lines 303 and 304 by supplying a read signal to the first type of read signal lines 301 shown in FIG. 3 at the first frame rate and the processing step of outputting second color component (e.g., G) image data through the output signal lines 303 and 304 by supplying a read signal to the second type of read signal lines 302 at the second frame rate that is lower than the first frame rate are performed. Such a computer program may be stored on a storage medium such as a semiconductor memory.

The present disclosure can be used in an image capture device which captures a color moving picture and in a video appliance or system, a video synthesizer, a video editor, or a video restoration device in which such an image capture device is built. The present disclosure can also be implemented as a computer program that describes the image capturing control operation by the image capture device.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A solid-state image sensor comprising:
   a pixel array including a plurality of pixels that are arranged in columns and rows;
   a plurality of read signal lines, each of which is connected to a number of pixels that are arranged in a row direction;
   a plurality of output signal lines, each of which is connected to a number of pixels that are arranged in a column direction;
   a color filter array which defines the color red, blue and green components of light rays to be incident on the plurality of pixels; and
   a peripheral circuit having the function of reading pixel signals from the pixel array at a first frame rate and at a second frame rate which is lower than the first frame rate,
   wherein the read signal lines are classified into a first type of read signal lines, each of which is connected to a group of pixels from which pixel signals are read at the first frame rate, and a second type of read signal lines, each of which is connected to a group of pixels from which pixel signals are read at the second frame rate, and
   wherein among a plurality of pixels which are connected to each said first type of read signal line, two pixels on two adjacent columns are arranged on two opposite sides with respect to the first type of read signal line, and
   wherein among a plurality of pixels which are connected to each said second type of read signal line, two pixels on two adjacent columns are arranged on two opposite sides with respect to the second type of read signal line, and
   wherein the pixels on which light rays with the color red and blue components are incident are connected to the first type of read signal line, and the pixels on which light rays with the color green components are incident are connected to the first and second types of read signal lines.

2. The solid-state image sensor of claim 1, wherein the first and second types of read signal lines are arranged alternately with each other.

3. The solid-state image sensor of claim 1, wherein pixels on which light rays with the color red and blue components are incident are not connected to any of the second type of read signal lines.

4. The solid-state image sensor of claim 1, wherein pixels on which light rays with the color red, blue and green components are incident are connected to each said first type of read signal line.

5. A solid-state image sensor comprising:
   a pixel array including a plurality of pixels that are arranged in columns and rows;
   a plurality of read signal lines, each of which is connected to a number of pixels that are arranged in a row direction;
   a plurality of output signal lines, each of which is connected to a number of pixels that are arranged in a column direction;
   a color filter array which defines the color yellow, cyan, green and magenta components of light rays to be incident on the plurality of pixels; and
   a peripheral circuit having the function of reading pixel signals from the pixel array at a first frame rate and at a second frame rate which is lower than the first frame rate,
   wherein the read signal lines are classified into a first type of read signal lines, each of which is connected to a group of pixels from which pixel signals are read at the first frame rate, and a second type of read signal lines, each of which is connected to a group of pixels from which pixel signals are read at the second frame rate, and
   wherein among a plurality of pixels which are connected to each said first type of read signal line, two pixels on two adjacent columns are arranged on two opposite sides with respect to the first type of read signal line, and
   wherein among a plurality of pixels which are connected to each said second type of read signal line, two pixels on two adjacent columns are arranged on two opposite sides with respect to the second type of read signal line, and
   wherein the pixels on which light rays with the color yellow and cyan components are incident are connected to the first type of read signal line, and the pixels on which light rays with the color green and magenta components are incident are connected to the first and second types of read signal lines.

6. The solid-state image sensor of claim 1, wherein arrangement of pixels shifts by a half pixel pitch either between two adjacent rows of pixels or between two adjacent columns of pixels.

7. The solid-state image sensor of claim 1, wherein there is a time lag between a time when the peripheral circuit reads the pixel signals at the second frame rate and a time when the peripheral circuit reads the pixel signals at the first frame rate within the same frame.

8. The solid-state image sensor of claim 7, wherein the peripheral circuit includes:
   a first read circuit which reads an image signal at the first frame rate by driving the first type of read signal lines, thereby outputting a first color component signal; and
   a second read circuit which reads an image signal at the second frame rate by driving the second type of read signal lines, thereby outputting a second color component signal.

9. The solid-state image sensor of claim 8, wherein the first read circuit includes a binning circuit which performs binning processing on pixel signals supplied from the pixel array.

10. The solid-state image sensor of claim 1, wherein the plurality of read signal lines, the plurality of output signal lines, and the color filter array are arranged on the surface of a semiconductor substrate on which the pixel array has been formed, and light is incident on the pixel array from over the surface of the semiconductor layer.

11. The solid-state image sensor of claim 1, wherein the plurality of read signal lines and the plurality of output signal lines are arranged on the surface of a semiconductor layer on which the pixel array has been formed, and
   wherein the color filter array is arranged on the back surface of the semiconductor layer, and
   wherein light is incident on the pixel array through the back surface of the semiconductor layer.

12. A solid-state image sensor comprising:
   a pixel array including a plurality of pixels that are arranged in columns and rows;
   a plurality of read signal lines, each of which is connected to a number of pixels that are arranged in a row direction;
   a plurality of output signal lines, each of which is connected to a number of pixels that are arranged in a column direction;
   a color filter array which defines the color red, blue and green components of light rays to be incident on the plurality of pixels; and
   a peripheral circuit having the function of reading pixel signals from the pixel array at a first frame rate and at a second frame rate which is lower than the first frame rate,
   wherein the read signal lines are classified into a first type of read signal lines, each of which is connected to a group of pixels from which pixel signals are read at the first frame rate, and a second type of read signal lines, each of which is connected to a group of pixels from which pixel signals are read at the second frame rate, and
   wherein among a plurality of pixels which are connected to each said first type of read signal line, two pixels on two adjacent columns form part of two different rows, and
   wherein among a plurality of pixels which are connected to each said second type of read signal line, two pixels on two adjacent columns form part of two different rows, and
   wherein the pixels on which light rays with the color red and blue components are incident are connected to the first type of read signal line, and the pixels on which light rays with the color green components are incident are connected to the first and second types of read signal lines.

13. An image capture device comprising:
   the solid-state image sensor of claim 1;
   an optical system which images light on the pixel array of the solid-state image sensor; and
   a signal processing section which processes output signals of the solid-state image sensor.

14. The image capture device of claim 13, wherein the signal processing section includes an image processing section which generates a synthetic color moving picture based on signals that have been read from the first type of read signal lines and on signals that have been read from the second type of read signal lines.

15. An image sensor driving method for driving the solid-state image sensor of claim 1, the method comprising the steps of:
   getting image data through the output signal lines by supplying read signals at the first frame rate to the first type of read signal lines; and
   getting image data through the output signal lines by supplying read signals at the second frame rate, which is lower than the first frame rate, to the second type of read signal lines.

16. A computer program that stored on a non-transitory computer-readable medium which is used in a device that includes the solid-state image sensor of claim 1 and a processor, the computer program being defined to make the processor perform the steps of:

outputting image data of the first set of color components through the output signal lines by supplying read signals at the first frame rate to the first type of read signal lines; and outputting image data of the second set of color components through the output signal lines by supplying read signals at the second frame rate, which is lower than the first frame rate, to the second type of read signal lines.

17. A non-transitory storage medium having stored thereon the computer program of claim 16.

* * * * *